United States Patent [19]

Schofield, Jr.

[11] 4,351,014

[45] Sep. 21, 1982

[54] SOLID STATE SELF-CHECKING RELAY

[75] Inventor: George L. Schofield, Jr., Romona, Calif.

[73] Assignee: Xenex Corporation, Birmingham, Mich.

[21] Appl. No.: 170,323

[22] Filed: Jul. 18, 1980

[51] Int. Cl.³ .............................................. H02H 3/00
[52] U.S. Cl. .................................... 361/100; 361/54; 361/104
[58] Field of Search .................. 361/104, 100, 54, 55, 361/56, 57; 307/134, 100

[56] References Cited

U.S. PATENT DOCUMENTS 3,761,734 9/1973 Windecker ........................ 361/104

Primary Examiner—Reinhard J. Eisenzopf

Attorney, Agent, or Firm—Reising, Ethington, Barnard, Perry & Brooks

[57] ABSTRACT

A solid state relay is disclosed which is failsafe in the sense that it is prevented from failing in a closed circuit condition. The relay comprises a main switch adapted to be connected in series with a load and voltage source and responsive to relay opening and closing signals. A secondary switch is connected in parallel with the load and is switched a sense opposite that of the main switch by the relay opening and closing signals. If the main switch fails to open, the secondary switch is closed and the load is short circuited by it. Additionally, a fuse in series with the main switch is blown by the current through the secondary switch to latch the relay in the open circuit condition. Self-checking circuits are provided to latch the relay an open circuit condition if there is any circuit failure.

17 Claims, 6 Drawing Figures

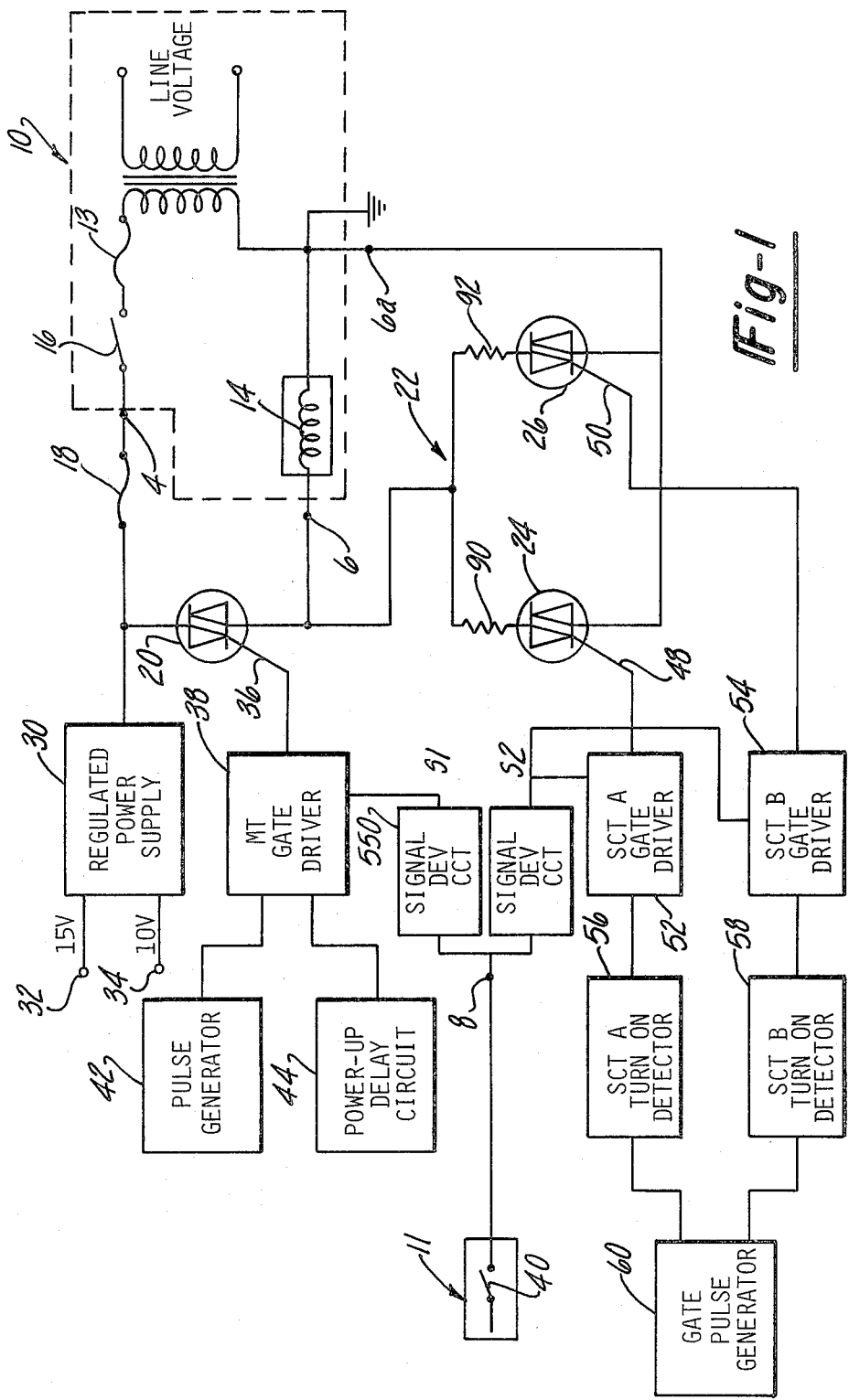

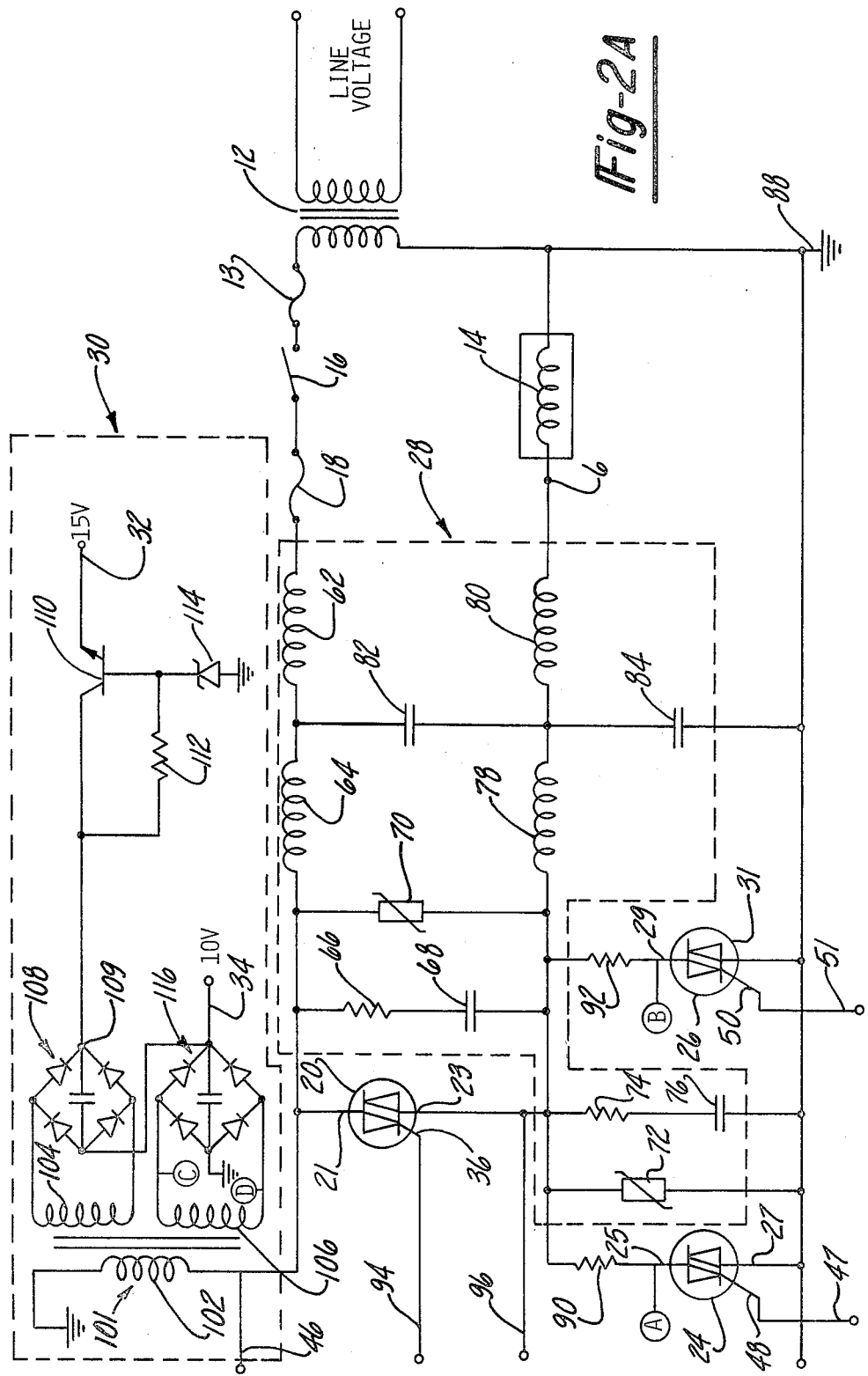

1

SOLID STATE SELF-CHECKING RELAY

TECHNICAL FIELD

This invention relates to electrically actuated switching devices or relays: more particularly, it relates to solid state relays and self-checking circuits therefor.

BACKGROUND ART

In electrical and electronic circuits, electrically actuated switches or relays are commonly used for performing switching functions, i.e. opening and closing a circuit, in response to a control signal. In a relay-controlled circuit which is used for signaling or control functions, relatively small currents are switched. In many such applications the relay takes the form of a semiconductor or solid state switch. In other applications where relatively large currents are switched or because of the environment, electromechanical relays are commonly used. Solid state switching devices are now available for switching both AC and DC circuits at relatively large currents.

There are applications in which the operation of a relay is of vital importance in performing a control function and a failure thereof may result in equipment failure of serious consequence. For example, on control systems for safeguarding hazardous industrial machines, such as punch presses, a relay is employed to energize the press control circuit for starting and stopping the press. In an emergency situation, the press is brought to a stop by opening the relay switch to deenergize the control circuit. The relay is controlled by an intrusion detector on the press which produces a turn-off signal for the relay in case the operator reaches too close to the pinch point of the press. If the relay should fail during operation so that it is stuck in the closed state, the machine may cause injury to the operator or damage to the machine. In such applications, it is desirable to prevent relay failure from resulting in an unsafe circuit condition. It should be fail-safe and self-checking.

Electromechanical relays are in some respects well suited for control circuits of industrial machines. One favorable attribute is that the electromechanical relay exhibits a high degree of immunity to false switching due to voltage transients and other electrical noise which is often present in an industrial environment. One of the major drawbacks of the electromechanical relay is an inherently short life relative to that of solid state devices.

Solid state relays or switches for control circuits offer many advantages over electromechanical relays including faster switching, low power actuation, small size and long life. However, the solid state relay is inherently susceptible to electrical noise such that voltage transients with relatively low level rates of voltage change may produce unwanted switching of the relay. It is not suitable, without special associated circuitry, for use in industrial control circuits where false switching cannot be tolerated. If the solid state relay is rendered substantially immune to voltage transients, it is suited for many control circuit applications. However, for many applications it should be fail-safe and self-checking.

It is an objective of this invention to provide and improved electrically actuated switch or relay and self-checking circuits therefor.

SUMMARY OF THE INVENTION

In accordance with this invention, a relay is provided which is fail-safe; the relay is operative to interrupt the relay-controlled circuit in response to a relay opening signal, even if the main switch of the relay fails in a closed condition. This is accomplished by a relay circuit in which the main switch, connected in the relay-controlled circuit in series with the load and an electric power source, is closed or opened by relay closing and opening signals, respectively. A secondary switch is connected in parallel with the load and is opened or closed in response to relay closing and relay opening signals, respectively. Thus, if the main switch fails to open in response to a relay opening signal, the secondary switch will be closed and will deenergize the load by providing a short circuit around it.

Further, in accordance with this invention, a fail-safe relay of the type aforesaid is provided which will latch in the open circuit condition in response to a failure of the main switch to open. This is accomplished by a current responsive circuit breaker in series with the main switch and adapted to open in response to the current through the secondary switch when the main switch fails to open. Preferably, the current responsive circuit breaker is a fuse which provides a fast response time in opening the relay-controlled circuit. The latching feature insures that supervisory intervention will be required before the relay can be operated, after failure, to again close the relay-controlled circuit.

In accordance with this invention, a solid state relay is provided with a fail-safe circuit to prevent the relay from failing in a closed circuit condition. This is accomplished by a main thyristor connected in series between the load and a power source with a secondary thyristor connected in parallel with the load. A control circuit selectively produces a relay closing signal or a relay opening signal which is used for switching the main thyristor and the secondary thyristor to opposite switching or conductive conditions. A first signal developing means turns on the main thyristor in response to a relay closing signal and turns it off in response to relay opening signal. A second signal developing means turns off the secondary thyristor in response to a relay closing signal and turns it on in response to a relay opening signal. Accordingly, the load is deenergized by short circuiting thereof through the secondary thyristor in the event that the main thyristor fails to turn off in response to a relay opening signal. Further, according to the invention, the relay is latched in the open circuit condition in the event that the main thyristor fails to open. This is accomplished by a current responsive circuit breaker connected in series with the load and being adapted to open in response to the short circuit current through the secondary thyristor. For use in a control circuit having an AC voltage source, the main and secondary thyristors are preferably bi-directional triode thyristors, commonly known as triacs. The main triac and the secondary triac are switched substantially simultaneously to achieve fast opening and closing of the relay-controlled circuit for all conditions; however, to prevent inadvertent opening of the circuit breaker, timing means are provided to insure that the secondary triac is turned off slightly before the main triac is turned on and to insure that the main triac is turned off slightly before the secondary triac is turned on. This is accomplished by timing means in the first and second signal developing means. Further, according to the invention, the relay is provided with means to protect it and associated circuits against damage or spurious turn on of the triacs by voltage transients which might arise from switching or the like in another portion of the relay or associated circuits. This is accomplished by a suppression network or snubber circuit connected in circuit with the triacs in a manner to limit the maximum rate of change of voltage and the peak voltage across the triacs without interfering with the intended switching function thereof.

In accordance with this invention, a solid state fail-safe relay is provided with self-checking to insure that the relay is latched in an open circuit condition in the event of any circuit failure in the relay. This is accomplished in a relay of the type aforesaid by means for applying a self-checking signal to the secondary triac and detecting the response thereto as an indication of the operability of the secondary triac. Preferably, to facilitate self-checking, a pair of secondary triacs (referred to herein as self-checking triacs, or SCT's) are provided in parallel with each other and the load. Self-checking means includes means for alternately turning on the pair of self-checking triacs, while the relay is closed, through the main triac and for detecting current flow through the self-checking triacs during the self-check signal. Means are provided for turning on and holding at least one of the self-check triacs in the turned on condition if any part of the circuit fails the self-check test.

According to the invention, self-checking is performed on all circuits of the relay during its operational period without interfering with the normal operation of the relay. This is accomplished by providing periodic self-check pulses which are timed in relation to the AC supply voltage so that the self-checking triacs are tested at a high repetition rate for switching operability. Preferably, the selfcheck pulses are produced by a generating means synchronized with the line voltage supplied to the relaycontrolled circuit.

A more complete understanding of this invention may be obtained from the detailed description that follows taken with the accompanying drawings.

DESCRIPTION OF THE DRAWINGS

FIG. 1 is a generalized block diagram view of the self-checking control circuit of the present invention;

FIGS. 2A–D are detailed schematic views of the control circuit shown in the block diagram of FIG. 1.

BEST MODE FOR CARRYING OUT THE INVENTION

General Description

Figure 2B:
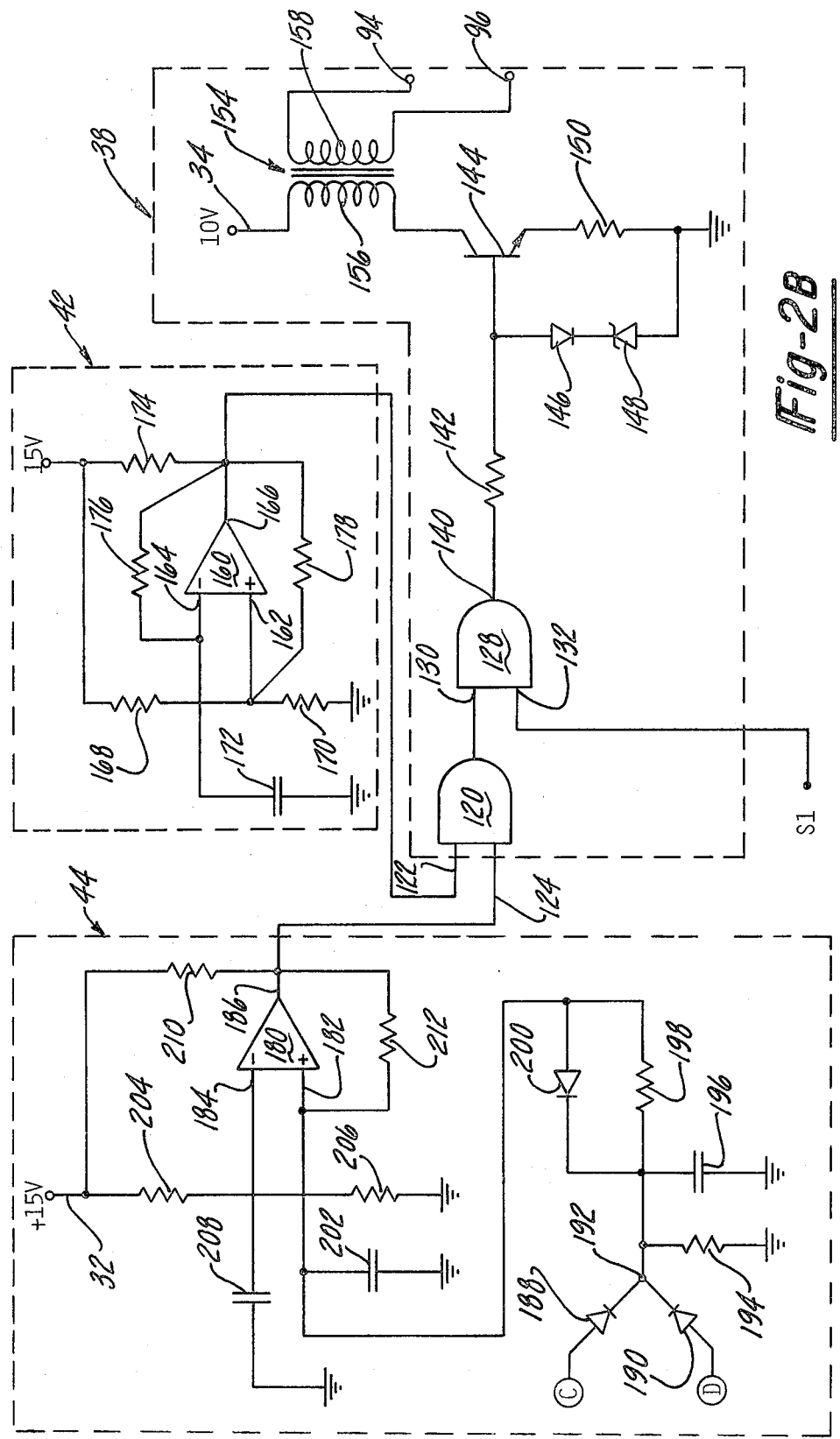
Figure 2C:
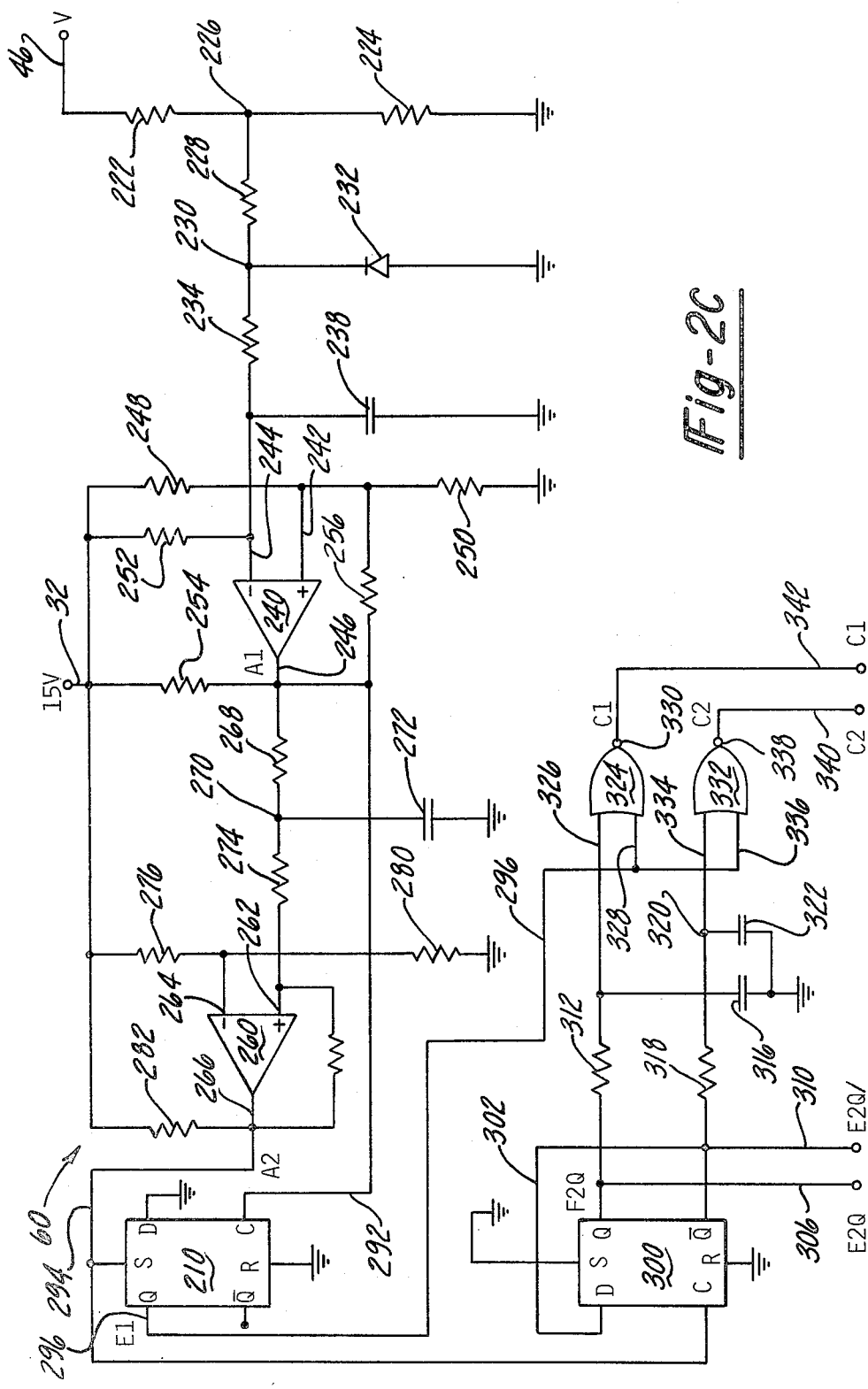

Referring now to the drawings, an illustrative embodiment of the invention is shown in a solid state self-checking relay. In this embodiment, the relay includes a main switch which is turned on or off by an electrical signal to control power to a load. The main switch is implemented with a bidirectional triode thyristor, commonly known as a triac. In order to make the relay fail-safe and self-checking, additional circuitry is provided. This includes a pair of secondary switches, hereinafter referred to as self-checking triacs, which are connected in parallel across the load. A relay opening signal causes a turn-off signal to be applied to the main triac and a turn-on signal to be applied to the self-checking triacs to bypass or short circuit the load and thereby deenergize it, in the event that the main triac fails to turn off. A fuse in series with the load is blown by the short circuit and serves as a latch to hold the load deenergized. A turn-off signal is applied to the self-checking triacs in response to a relay closing signal so that the fuse will not be blown in the normal operation of turning on the main triac. Self-checking circuits are coupled with the self-checking triacs for checking them periodically while the main triac is closed to ascertain whether the self-checking triacs are operative, i.e. able to switch from an open condition to a closed condition in response to a turn-on signal. If either of the self-checking triacs are found to be inoperative, the other is closed and, as a result, the fuse is blown to interrupt power to the load.

This illustrative embodiment of the invention will be described in connection with a control circuit for an industrial machine, such as a punch press, equipped with an electronic safeguarding device for stopping the press in case the operator reaches into a dangerous zone of the press. The relay of this invention is controlled by an electronic intrusion detector for interrupting the electrical power to the control circuit of the machine. It will be appreciated, as the description proceeds, that the invention may be implemented in many different ways and may be utilized in other applications.

The relay of this invention is shown in block diagram of FIG. 1. The relay has three load terminals 4, 6 and 6a for connection into a machine control circuit 10 which is to be switched by the relay. It also has a control terminal 8 and common return 8a for connection with a relay control switch. The relay will be described in connection with a machine control circuit 10 of a punch press which is equipped with an electronic intrusion detector 11.

The relay control switch 40 is part of an electronic intrusion detector 11 and is adapted to apply a logic level voltage to the control terminal 8. The intrusion detector 11 is adapted to sense the intrusion of the operator's hand into a hazardous zone of the machine and produce an alarm signal for stopping the press. In the normal operating condition of the press, the switch 40 of the intrusion detector 11 is closed and it applies a relay closing signal, a logic high voltage, to the control terminal 8. However, in the event of an intrusion into the hazardous zone, the switch 40 is opened and a relay opening signal, a logic low voltage, is applied to the control terminal 8.

The machine control circuit 10 includes a solenoid valve 14 which constitutes the electrical load to be controlled, i.e. energized or deenergized by the relay. The solenoid valve 14 controls the clutch and brake in the drive train of the press. When the solenoid valve is energized the clutch is engaged and the brake is released for running the press and when the valve is deenergized the clutch is disengaged and the brake is applied to stop the press. The control circuit includes a manual switch 16 for use by the press operator and numerous other control switches and relays (not shown) between terminal 6 and solenoid valve 14. In order to provide for interruption of the press control circuit under the control of the electronic intrusion detector 11, the relay is connected in series with the solenoid valve 14. A connection 6a is also provided so that the self-checking triacs parallel the solenoid valve 14. The press control circuit is connected with an AC voltage source through a transformer 12. That portion of the control circuit which is enclosed within the dashed lines 10 is part of the conventional machine control circuit. The machine control circuit thus includes the manual switch 16, solenoid valve 14 and the load terminals 4 and 6 of the relay in series across the secondary of the transformer 12.

The relay comprises a main triac 20 with its upper main terminal connected through the fuse 18 to the relay load terminal 4 and its lower main terminal connected directly with the relay load terminal 6. The main triac 20 also has a gate terminal 36 which is adapted to receive turn-on and turn-off signals from associated circuitry to be described subsequently.

In addition to the main triac 20, the relay includes secondary switching means 22. The secondary switching means 22 are connected in parallel with the solenoid 14 and function to provide a low impedance bypass of the solenoid to deenergize it in the event the main triac 20 fails to open upon the occurrence of a relay opening signal. The secondary switching means 22 include first and second triacs 24 and 26 which are connected in parallel across the solenoid 14. The triacs 24 and 26 are referred to as self-checking triacs for reasons which will appear subsequently. The triacs 24 and 26 have respective gate terminals 48 and 50 which receive a turn-off signal from associated circuits in response to a relay closing signal and a turn-on signal in response to a relay opening signal.

The relay also includes self-checking circuitry which continuously monitors the operativeness of the circuits of the entire relay. This includes self-checking of the triacs 24 and 26 periodically and in synchronism with the supply voltage. If one of the triacs 24 or 26 is found to be inoperative, the other of the triacs is closed to provide a low impedance path bypassing the solenoid 14 for the purpose of deenergizing it. If the voltage across the closed triac (24 or 26) and its series resistor (90 or 92) is low enough, the load will be deenergized by the low impedance bypass; if not, the current will be sufficient to blow the fuse 18, thereby latching the control circuit in an open state. The fuse 18 and its other functions will be discussed below.

In general, the operation of the relay is as follows. During operation of the press, the switch 16 is closed and the relay is closed, i.e. main triac 20 is turned-on or closed and the triacs 24 and 26 are turned-off or opened. The triacs 24 and 26 are checked in synchronism with the line voltage during normal operation to determine their operativeness. If one is found to be inoperative, the other is caused to close, blowing the fuse. In the event of an alarm signal from the intrusion detector 11, as represented by opening of the switch 40, the main triac 20 is opened and the triacs 24 and 26 are closed. The opening of the main triac 20 interrupts energization of the solenoid which causes the press to stop. However, should the main triac 20 fail to open in response to an alarm signal and remain closed, the closing of the self-check triacs will cause sufficient current to be drawn through the fuse to blow it, disconnecting the voltage from the load.

A gate driver circuit 38 identified as MT GATE DRIVER drives the gate terminal 36 of the main triac 20. The driver circuit 38 receives a control signal S1 from a signal developing circuit 550 in response to an alarm signal from the intrusion detector 11.

A pulse generator 42 provides pulses of controlled magnitude and frequency to the gate driver circuit 38 for use in driving the gate terminal 36 of the main switch 20.

A power-up delay circuit 44 provides a controlled delay of the closing of the main triac 20 to assure that, on power-up of the circuit 10, there is not a brief transitory period when both the main triac 20 and the triacs 24 and 26 are closed.

A gate driver circuit 52 (SCT A GATE DRIVER) controls energization of the gate terminal 48 of the triac 24, and a like gate driver circuit 54 (SCT B GATE DRIVER) controls energization of the gate terminal 50 of the triac 26. Both of the gate driver circuits 52 and 54 receive a control signal S2 from a signal developing circuit 552 in response to an alarm signal from the intrusion detector 11.

A pair of turn-on detectors 56 and 58 SCT A TURN ON DETECTOR and SCT B TURN ON DETECTOR are respectively connected to the gate driver circuits 52 and 54. A function of the turn-on detector 56 is to detect whether triac 26 is operative and the function of detector 58 is to detect whether triac 24 is operative. If one of the triacs 24 or 26 is found to be inoperative the other is closed to short out the solenoid 14 and blow the fuse 18. The turn-on detectors also perform self-checking on other components of the circuit.

A gate pulse generator 60 provides line synchronized gate pulses to each of the turn-on detectors 56 and 58 to synchronize the checking of the triacs 24 and 26 with the line voltage.

A power supply 30 receives the voltage from the transformer 12 and produces a regulated 15 volt supply on terminal 32 and an unregulated 10 volt supply on terminal 34.

FIGS. 2A–D illustrate the relay of FIG. 1 in full schematic detail. With reference to FIG. 2A, the transformer 12 has a supply voltage, suitably 220 volts and 60 Hz, applied across the primary winding and produces an output voltage of 120 volts across the secondary winding. The transformer also provides isolation from the main power lines. The on-off switch 16, the fuse 18 and the main triac 20 are connected in series with the solenoid 14 across the secondary winding of the transformer. The parallel-connected self-checking triacs 24 and 26 are connected in parallel with the solenoid 14.

Snubber Circuit

A snubber circuit 28 is connected to the main triac 20 and the self-checking triacs 24 and 26. The purposes of the snubber circuit are several: (1) to permit the main triac 20 to close and open reliably with a highly inductive load such as solenoid 14; (2) to prevent any opening and closing transients produced by the main triac from closing the triacs 24 and 26 and vice-versa; (3) to keep any switching transients caused by associated control circuitry on the press from closing either the main switch or a secondary switch when they are not supposed to be closed, (4) to prevent power line noise from causing spurious closings of any of the triacs; and (5) to prevent transients produced by the openings and closings of the triacs from getting onto the power lines.

The snubber circuit 28 is a form of suppression network which consists basically of series-connected resistors and capacitors connected in shunt with the triacs 20, 24 and 26. Specifically, the snubber circuit 28 includes a pair of series-connected inductors 62 and 64 connected between the fuse 18 and the upper main terminal 21 of the main triac 20. A resistor 66 and a capacitor 68 are connected across the main terminals 21 and 23 of the triac 20. Similarly, a varistor 70 is connected across the triac 20. A pair of inductors 78 and 80 are connected in series between the lower main terminal 23 of the triac 20 and the solenoid 14. A varistor 72 is connected between the lower main terminal 23 of the triac 20 and the lower main terminals 27 and 31 of the self-checking triacs 24 and 26. A resistor 74 is connected in series with a capacitor 76 between the lower main terminal 23 of the triac 20 and the lower main terminals 27 and 31 of the triacs 24 and 26. A capacitor 82 is connected between the common terminal of inductors 62 and 64 and the common terminal of inductors 78 and 80. Another capacitor 84 is connected between the common terminal of inductors 78 and 80 and the lower main terminals 27 and 31 of the triacs 24 and 26.

The varistors 70 and 72 protect the triacs 20, 24 and 26 from excessive voltages. A varistor ideally behaves like an open circuit in a prescribed range of voltages, and then acts like a battery with zero internal resistance for voltages outside of the range. The varistors 70 and 72 are selected to have transitional voltages larger than the normal operating voltages applied across the triacs 20, 24 and 26, but smaller than the device breakdown voltages of the triacs. The inductors 62, 64, 78 and 80 are selected to provide high impedance to high frequency transients, but provide negligible impedance to the line voltage frequency, typically 60 Hz. The capacitors 82 and 84 provide a low impedance shunt to ground for high frequency transients, and high impedance at the line frequency. The capacitor 68 and resistor 66 prevent the voltages across terminals 21 and 23 of triac 20 from changing rapidly with time, causing unwanted turn on of triac 20. Capacitor 68 keeps the voltage from changing rapidly and resistor 66 damps any oscillations and limits discharge currents out of capacitor 68 which might damage triac 20. Resistor 74 and capacitor 66 do the same for the self-check triacs 24 and 26.

Main and Self-Checking Triacs

The lower main terminal 23 of the triac 20 is connected through a resistor 90 to the upper main terminal 25 of the self-checking triac 24. Similarly, the lower main terminal 23 of the triac 20 is also connected to the upper main terminal 29 of the self-checking triac 26 through a resistor 92. The resistors 90 and 92 are selected to have relatively low ohmic values, and the voltage drop across them is used by the turn-on detector circuits 56 and 58 for self-checking purposes.

The main triac 20 is controlled by turn-on and turn-off signals which are applied to gate terminal 36 from a pulse transformer 154 (see FIG. 2B) through conductors 94 and 96. Similarly, the self-checking triac 24 is controlled by turn-on and turn-off signals applied to gate terminal 48, and the self-checking triac 26 is controlled by turn-on and turn-off signals applied to gate terminal 50. The signal is applied to gate terminal 48 through conductor 49 from the gate driver circuit 52 (see FIG. 2D) and the signal is applied to gate terminal 50 through conductor 51 from the gate driver circuit 54. The lower main terminals 27 and 31 of the self-checking triacs 24 and 26 are connected in common and to ground 88.

Figure 2D:
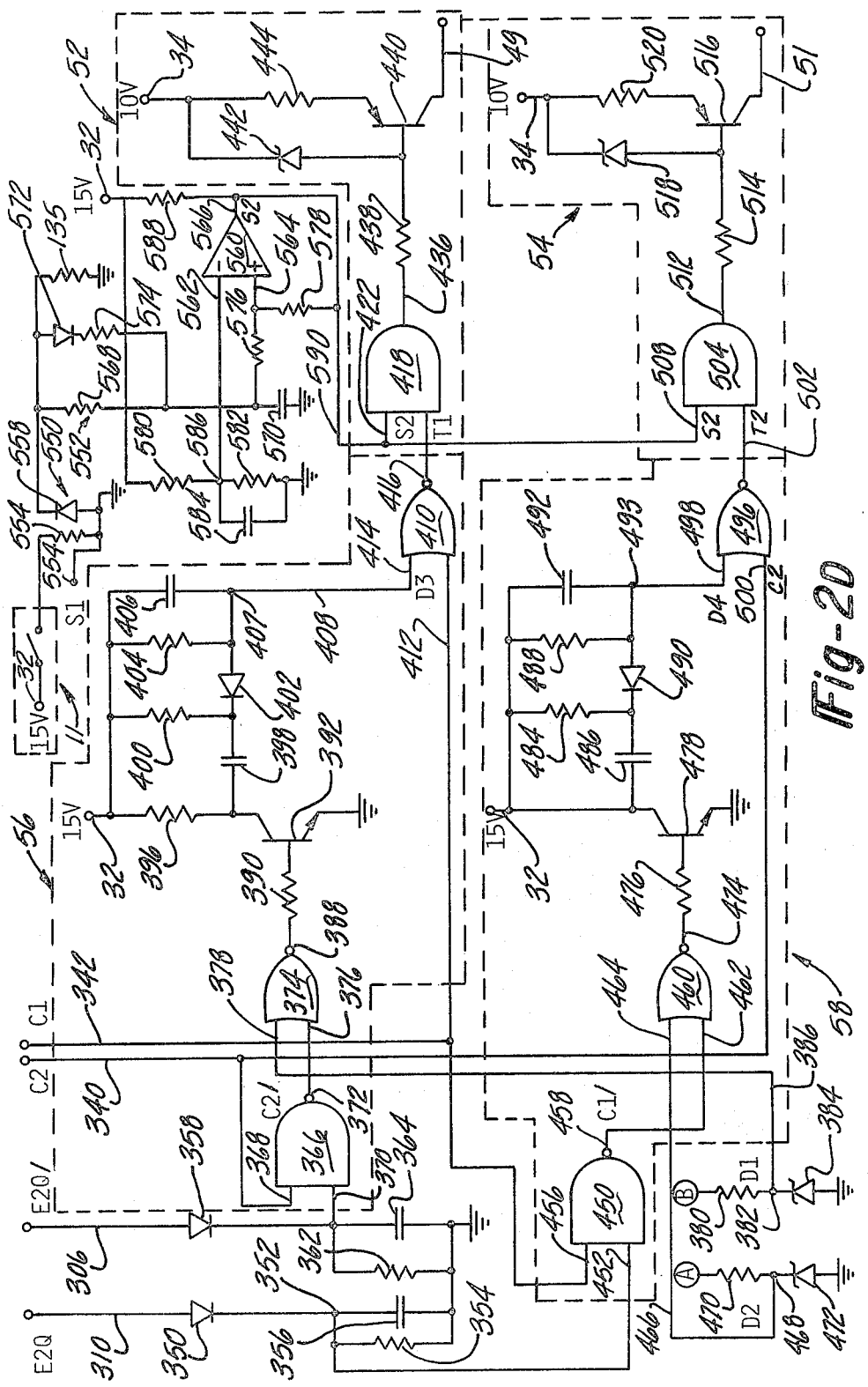

The upper main terminal 25 of the self-checking triac 24 is designated as node A and the signal appearing thereon is applied to the turn-on detector 58 (see FIG. 2D). The upper main terminal 29 of self-checking triac 26 is designated node B and the signal appearing thereon is supplied to the turn-on detector 56.

The Fuse

The fuse 18 serves the following functions in the relay circuit. It acts as a latch when it is blown to keep the load (solenoid 14) deenergized. The fuse deenergizes the load if either self-check triac fails to pass its self-check test. With the main triac 20 switched on and a failure of one of the secondary triacs 24 or 26 in an open-circuit condition, the self-checking operation will turn on the other secondary triac. The current then drawn by resistor 90 or 92 will blow the fuse. The fuse should be chosen such that its rated current is less than the current the transformer puts out when loaded by a resistance equal to that of resistor 90 or 92. The fuse also assures that the load will be deenergized in the event that the main triac 20 fails in a sufficiently low resistance short-circuited condition. If the resistance of the failed main triac is low compared to the values of the resistors 90 and 92 there will be sufficient voltage across the load (providing the transformer secondary voltage doesn't drop too much because of the high current) to keep it energized and thus the fuse is needed to deenergize the load. In order to bring the press to a stop as fast as possible in this case, the clearing time of the fuse should be as short as possible. Accordingly, a fast acting fuse should be selected.

If the resistance of the failed main triac is high compared to the values of the resistors 90 and 92, the closing of the secondary triacs will reduce the voltage across the load sufficiently to deenergize it. In this case there may not be sufficient current drawn to blow the fuse but it does not matter; the current drawn depends on resistance of the failed triac in series with the parallel combination of resistors 90, 92 and the load 14. The current drawn also depends on the current-voltage characteristics of the transformer. The values of resistors 90 and 92 should be equal and should be chosen for a particular transformer and load such that if the resistance of the failed main triac is just high enough to prevent the fuse from being blown, the voltage in the load should be just low enough for the load to drop out.

Mathematically:

$$I = \phi(V) \tag{1}$$

Where:
 I = current in transformer secondary
 V = voltage at transformer secondary
 $\phi$ = function describing transformer current-voltage characteristic $$V = I \left( R_{MT} + \frac{1}{\frac{1}{R_{90}} + \frac{1}{R_{92}} + \frac{1}{Z_L}} \right) \tag{2}$$

Where:
 $R_{MT}$ = resistance of the failed main triac
 $R_{90}$ = resistance of resistor 90
 $R_{92}$ = resistance of resistor 92
 $Z_L$ = impedance of solenoid 14

$$V_L > I \left( \frac{1}{\frac{1}{R_{90}} + \frac{1}{R_{92}} + \frac{1}{Z_L}} \right) \tag{3}$$

Where:

$V_L$=voltage at which 14 deenergizes $$I_F < I \quad (4)$$

Where:

$I_F$=clearing current of fuse

For a given transformer, a given solenoid impedance, $Z_L$, and given resistor values, $R_{90}$ and $R_{92}$, expressions (1) and (2) will predict a value for I for any given main triac failure resistance, $R_{MT}$. For proper functioning the fuse and resistors should be chosen such that either expression (3) or (4) or both are satisfied regardless of the value of $R_{MT}$. Resistance values $R_{90}$ and $R_{92}$ and the fuse should also be chosen such that I exceeds $I_F$ by an amount sufficient not to cause undue delay in blowing the fuse, as will be described subsequently. Resistance values $R_{90}$ and $R_{92}$ should not be chosen so low however that the surge rating of the self-check triacs 24 and 26 is exceeded and the resistors 90 and 92 themselves are destroyed before the fuse blows.

Power Supply

The function of the power supply 30 is to produce supply voltages of 15 volts regulated and 10 volts unregulated. The power supply 30 includes a transformer 101 having a primary winding 102 and a pair of secondary windings 104 and 106. The primary winding 102 is connected across the secondary winding of the transformer 12. The voltages across the terminals of the secondary winding 104 is applied to a full wave diode rectifier bridge 108. The output from the bridge is taken at terminal 109 and is applied to the collector terminal of an NPN transistor 110. A resistor 112 is connected between the collector and base terminals of transistor 110. A zener diode 114 having a breakdown voltage of approximately 16 volts is connected between the transistor base terminal and ground. The 15 volts regulated supply is taken from the emitter terminal of transistor 110 and appears on output terminal 32.

The voltage appearing across the output terminals of the secondary winding 106 is applied to a full wave diode rectifier bridge 116. In addition, the voltage across terminals C and D of winding 106 is applied to the power-up delay circuit 44 for purposes to be hereinafter described. The rectifier bridge 116 produces a supply voltage of 10 volts unregulated at terminal 34.

Main Triac Gate Driver

The gate driver circuit 38 for the main triac 20 is shown in FIG. 2B. It includes an AND gate 120 having input terminals 122 and 124 and an output terminal 126. The input terminal 124 receives an output signal from the power-up delay circuit 44 which will enable the operation of the gate driver circuit 38 when the input is at logic high and disable it when it is at logic low. The input terminal 122 receives the output pulses from the pulse generator 42.

A pulse appearing at AND gate output terminal 126 is applied to the input terminal 130 of an AND gate 128. The AND gate 128 has another input terminal 132 which receives the control signal S1 produced by the signal developing circuit 550. The control signal S1 is produced in response to an alarm signal from switch 40 in a manner which will be described hereinafter with reference to the signal developing circuit 550. Suffice it to say now that S1 goes logic high when switch 40 is closed and goes logic low when switch 40 is opened. When S1 is at logic high this appears at the input terminal 132, the AND gate 128 opens and passes pulses appearing at the input terminal 130 on to the output terminal 140.

A constant current pulse generator is coupled between the AND gate 128 and the gate of main triac 20. It comprises a transistor 144 and a pulse transformer 154. The output terminal 140 of AND gate 128 is connected through a resistor 142 to the base of the transistor 144. A diode 146 is connected in series with a zener diode 148 between the transistor base terminal and ground. The zener diode 148 is a low voltage avalanche zener diode which effectively limits the current through the transistor 144. The resistor 150 is connected between the emitter terminal and ground. When the gates 120 and 128 are open, the transistor 144 supplies a train of constant amplitude current pulses to the pulse transformer 154. The pulse transformer has a primary winding 156 connected between the 10 volt supply and terminal 34 and the collector terminal of the transistor 144. The current generated in the secondary winding 158 of the transformer 154 is applied through conductors 94 and 96 to the gate terminal 36 and lower main terminal 23, respectively, of the main triac 20, as shown in FIG. 2A.

Pulse Generator

The pulse generator 42 is used for developing a turn-on signal for the main triac 20. The turn-on signal is a relatively high frequency train of pulses, which is produced by the gate driver 38. For this purpose, the pulse generator produces a pulse train at about 50 KHz which is used for keying the gate driver 38. The use of a pulsed turn-on signal for the gate electrode of the main triac facilitates self-checking of the circuit. The pulsed turn-on signal being at a frequency which is high relative to the line voltage frequency is essentially equivalent to a DC turn-on voltage.

The pulse generator 42 includes a comparator 160 having a non-inverting input terminal 162, an inverting input terminal 164 and an output terminal 166. A pair of resistors 168 and 170 are connected in series between the 15 volt supply terminal 32 and ground. The common terminal of resistors 168 and 170 is connected to the non-inverting input terminal 162. The inverting input terminal 164 is connected through a capacitor 172 to ground. A pull-up resistor 174 is connected between the supply terminal 32 and the output terminal 166. A resistor 176 is connected between the output terminal 166 and the input terminal 164. A resistor 178 is connected between the output terminal 166 and the positive input terminal 162. The output signal from the pulse generator circuit is a train of periodic pulses at a controlled frequency. These pulses are applied to the input terminal 122 of the AND gate 120 as previously described.

Power-Up Delay Circuit

The power-up delay circuit 44 is provided to delay closing of the main triac 20 at power-up until the circuits controlling the self-checking triacs 22 and 24 have time, on power-up, to generate opening signals so that the self-checking triacs 22 and 24 are not closed simultaneously with the main triac. The delay circuit 44 includes a comparator 180 having a non-inverting input terminal 182, an inverting input terminal 184 and an output terminal 186. A pair of resistors 204 and 206 are connected in series between the 15 volt regulated supply terminal 32 and ground. The common terminal of the resistors 204 and 206 is connected to the inverting input terminal 184. A capacitor 208 is connected between the inverting input terminal 184 and ground. A pull-up resistor 210 is connected between the supply terminal 32 and the output terminal 186. A resistor 212 is connected between the output terminal 186 and the non-inverting input terminal 182 and a capacitor 202 is connected between the input terminal 182 and ground.

The terminals C and D of the transformer secondary winding 106 in the power supply (FIG. 2A) are connected to the input of the power-up delay circuit 44. The terminals C and D are connected through respective diodes 188 and 190 to node 192. The diodes 188 and 190 form half of a full wave rectifier bridge; the other half of the bridge is formed by the two "negative" diodes in the rectifier bridge 116 of FIG. 2A. A resistor 194 and a capacitor 196 are connected in parallel between the node 192 and ground. The node 192 is connected through the parallel connection of the resistor 198 and diode 200 to the non-inverting input terminal 182 of the comparator 180. The capacitor 202 is charged through the resistor 198, and discharges through the diode 200 and resistor 194. A rapid discharge of the capacitor 202 is desired so that a proper power-up delay can again be generated in case a subsequent power-up operation is called for immediately following a power-down. The comparator output signal on terminal 186 will be logic low until the capacitor 202 charges up to equal the voltage applied to the input terminal 184. Thereafter the comparator output signal will be logic high. A logic low signal applied to the input terminal 124 of AND gate 120 blocks the passage of pulses from AND gate input terminal 122 to output terminal 126, a logic high signal on the input terminal 124 permits the pulses to pass through.

Line Synchronized Gate Pulse Generator

The function of the line synchronized gate pulse generator 60 (see FIG. 2C) is to provide timing signals E2Q and E2Q/ and self-check pulses C1 and C2 (see FIG. 3) to turn-on detector circuits 56 and 58. (The virgule is hereinafter used to indicate the inverted or complementary state). The self-check signals are synchronized with the line voltage cycle and timed within the cycle to permit testing of each of the self-checking triacs 24 and 26 once every other negative-going zero crossing of the line voltage. The line synchronized gate pulse generator 60 comprises a comparator 240 which produces an output signal A1 (see FIG. 3) which goes to logic high whenever the supply voltage goes lower than a predetermined value, specifically 19 volts. The input signal to the gate pulse generator 60 is derived from the line voltage through the transformer 12 (see FIG. 2A) and is applied to the gate pulse generator through conductor 46. This signal appears in FIG. 3 as the upper sinusoidal curve labeled "SUPPLY VOLTAGE". This voltage has a frequency of 60 hz and an RMS voltage of 120 volts. The supply voltage on conductor 46 is applied across a voltage divider network including the serial connection of a pair of resistors 222 and 224. The scaled output voltage from the voltage divider network is taken from node 226 and applied through a resistor 228 to node 230. A diode 232 has its cathode connected to the node 230 and its anode connected to ground. The purpose of the diode 232 is to keep the voltage at node 230 from going negative to an extent that would exceed the input voltage rating of the comparator 240. The voltage at node 230 is applied through a resistor 234 to node 236 and a capacitor 238 is connected between node 236 and ground to stabilize the comparator during transitions.

The comparator 240 has a non-inverting input terminal 242, an inverting input terminal 244 and an output terminal 246. The voltage at node 236 is applied directly to the inverting input terminal 244. A resistor 252 is connected between the 15 volt regulated supply terminal 32 and the input terminal 244. A pair of resistors 248 and 250 are connected in series between the supply terminal 32 and ground and the common terminal thereof develops a reference voltage which is applied to the input terminal 242. A pull-up resistor 254 is connected between the supply terminal 32 and the output terminal 246. A resistor 256 is connected between the output terminal 246 and the input terminal 242. The comparator output signal A1 appearing at terminal 246 appears in FIG. 3 in the curve labeled "A1". This signal goes high approximately 300 microseconds before the positive-to-negative zero crossing of the supply voltage, and remains high until approximately 300 us after the negative-to-positive zero crossing of the same.

Figure 3:
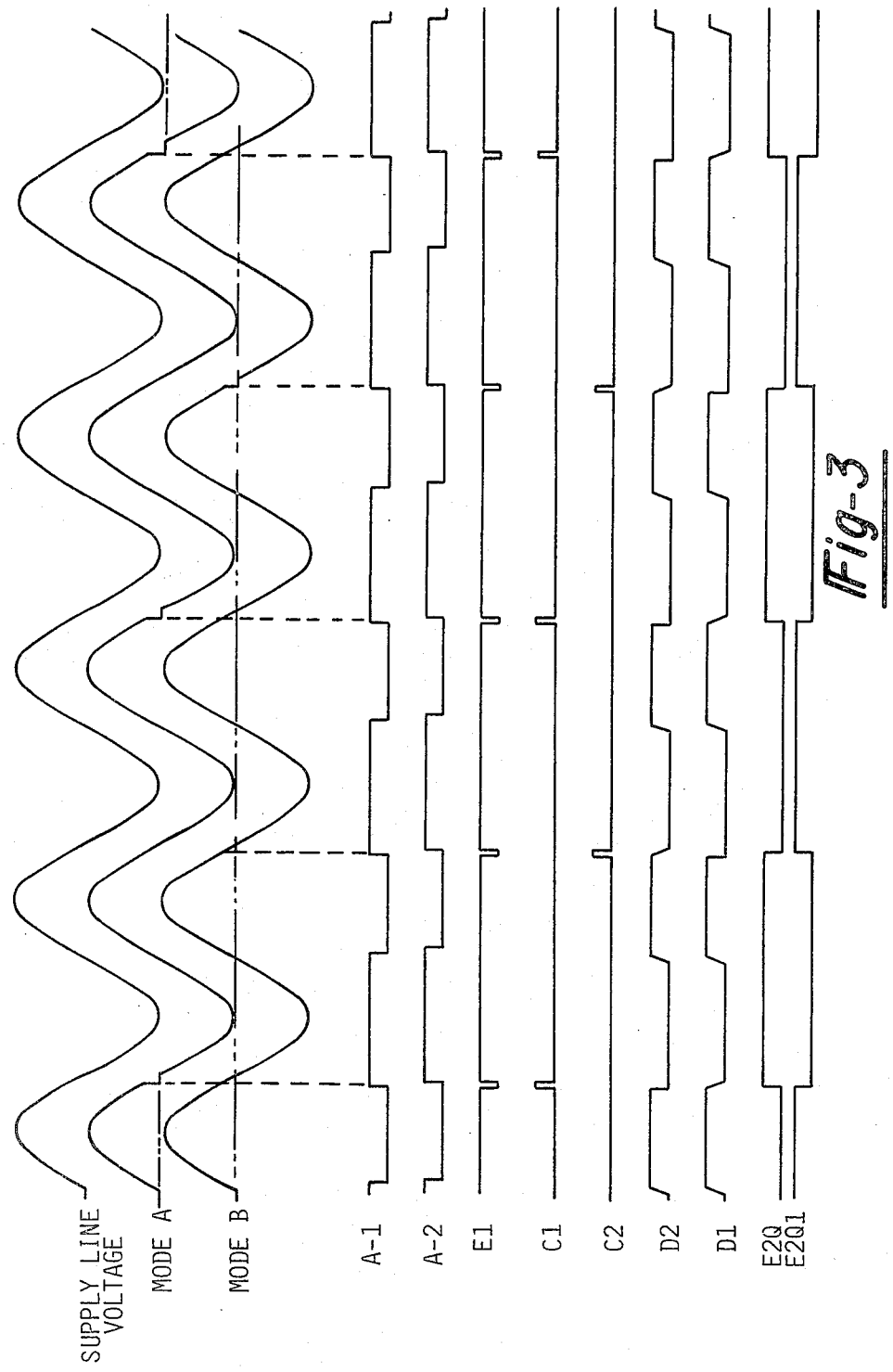
FIG. 3 is a timing diagram of certain signals which occur in the detailed schematic circuit of FIGS. 2A–D.

The gate pulse generator 60 also includes a comparator 260 which governs the width of the self-check pulses by interposing a time delay after the signal A1 goes to logic high. The signal A1 appearing on the comparator output terminal 246 is applied through a resistor 268 to a node 270. A capacitor 272 is connected between the node 270 and ground. The comparator 260 has a non-inverting input terminal 262, an inverting input terminal 264 and an output terminal 266. The voltage at the node 270 is applied through a resistor 274 to the input terminal 262. A voltage divider network including a pair of resistors 276 and 280 is connected in series between the supply terminal 32 and ground. The common terminal 278 of the resistors 276 and 280 is connected directly to the input terminal 264. A pull-up resistor 282 is connected between the supply terminal 32 and the output terminal 266. A resistor 284 is connected between the output terminal 266 and the input terminal 262. The output signal A2 appearing at the comparator output terminal 266 is shown in FIG. 3. The output signal A2 is the same as signal A1 except that it is delayed by 100 microseconds. The signals A1 and A2 are used to develop the timing signals or self-check pulses C1 and C2 for self-checking of the triacs 24 and 26.

For the purpose of generating the self-check pulses C1 and C2 in response to the signals A1 and A2 from the comparators 240 and 260, a flip-flop 290 is provided. The flip-flop is of the D-type and has conventional terminals designated D, C, Q, Q/, S and R. The D terminal, typically the data input terminal, is grounded. The C or clock terminal receives the signal A1 on line 292 from the output terminal 246 of comparator 240. The reset terminal R is grounded. The set terminal S receives the signal A2 on line 294 from the output terminal 266 of comparator 260. The output signal E1 from the flip-flop 290 is produced on the output terminal Q and is applied through conductor 296 to a pair of NOR gates 324 and 332 which will be described subsequently. It is noted that signal E1 is high until the leading edge of the pulse A1 occurs and then it goes low for approximately 100 microseconds until the leading edge of the pulse A2 occurs.

A flip-flop 300, of the toggle type, receives the signal A2 from comparator 260 and coacts with the flip-flop 290 for the purpose of generating the self-check pulses C1 and C2. The flip-flop 300 receives the pulses A2 and toggles its outputs alternately high and low every time the signal A2 makes a positive transition from logic low to logic high.

The flip-flop 300 has conventional terminals D, C, Q, Q/, S and R. The terminals S and R are both connected to ground. The C terminal has applied to it the output signal A2 of comparator 260 through conductor 294. The D terminal is tied to the Q/ output terminal. The Q terminal produces an output signal E2Q which, as shown in FIG. 3, goes alternately high and low on successive positive going transitions of signal A2 from comparator 260. The Q/ terminal produces an output signal E2Q/ which is the inverse of the signal E2Q. These output signals are applied to the NOR gates 324 and 332.

The output signal E1 from the flip-flop 290 and the signals E2Q and E2Q/ from the flip-flop 300 are applied to the NOR gates 324 and 332 to develop the self-check pulses C1 and C2. The signal E1 is applied through conductor 296 to one input terminal 328 of gate 324 and to one input terminal 336 of gate 332. The signal E2Q is applied to the other input terminal 326 of gate 324 through a series resistor 312 and shunt capacitor 316. Similarly, the signal E2Q/ is applied to the other input terminal 334 of gate 332 through a series resistor 318 and a shunt capacitor 322. These resistor-capacitor networks provide delays in the times the signals from the flip-flop 300 reach the NOR gates 332 and 324 so that the NOR gates do not open before the gates are finished blocking the alternate pulses in the signal E1 from the flip-flop 290. The NOR gate 324 produces a self-check signal C1 which, as shown in FIG. 3, comprises a train of positive pulses at one-half the repetition frequency of the pulses in signal E1 with each pulse of signal C1 coinciding with alternate pulses in E1. The NOR gate 332 produces a self-check signal C2 which is a similar pulse train in which the pulses coincide with the remaining pulses in signal E1.

The output signals of the line synchronized gate pulse generator 60 are supplied to the turn-on detector circuits 56 and 58 for use in continual testing of the self-checking triacs 24 and 26. Specifically, the E2Q output signal of flip-flop 300 is carried on conductor 310; the E2Q/ output signal of flip-flop 300 is carried on conductor 306; the output signal C1 of NOR gate 324 is carried on conductor 342; and the output signal C2 of NOR gate 332 is carried on conductor 340.

Turn-On Detector Circuits

The turn-on detectors 56 and 58 (see FIG. 2D) are used in self-checking of the triacs 24 and 26; the detectors produce turn-on signals T1 and T2 for the respective triacs in response to the self-check pulses C1 and C2. The turn-on signals are produced alternately under the control of the signals E2Q and E2Q/. The turn-on detectors 56 and 58 also detect whether the respective triacs 24 and 26 actually turn on in response to the turn-on signals; if either one does not, the other is turned on and held on to short circuit the solenoid 14 and blow the fuse 18.

The output signals E2Q/ and E2Q from the line synchronized gate generator 60 are applied on conductors 306 and 310 as input signals to respective turn-on detector circuits 56 and 58. The signal on conductor 306 is applied through a diode 358 to a node 360. The node 360 is connected to ground through the parallel connection of a resistor 362 and capacitor 364. The signal appearing on conductor 310 is applied through a diode to a node 352. The node 352 is connected to ground through the parallel connection of a resistor 354 and capacitor 356.

The turn-on detector circuit 56 includes a NAND gate 366 which has one input terminal 368, another input terminal 370 and an output terminal 372. The input terminal 370 receives directly the rectified and filtered signal E2Q/ at the node 360. The input terminal 368 receives the signal C2 carried on conductor 340. A NOR gate 374 has one input terminal 376, another input terminal 378 and an output terminal 388. The input terminal 376 receives directly the signal appearing at NAND gate output terminal 372. The input terminal 378 receives indirectly, by way of conductor 386, the signal appearing at node B of FIG. 2A, i.e. the voltage across triac 26. More specifically, the signal at node B is applied through a resistor 380 to node 382. A zener diode 384 is connected between the node 382 and ground and clips the supply voltage to a logic high level for input to the NOR gate 374.

A signal D1 is derived at node 382 and is applied to NOR gate input terminal 378. This signal, as shown in FIG. 3, is a series of pulses derived from the supply voltage across the zener diode 384. The leading edge of each pulse is the supply voltage itself and the pulse levels off at the clipping level of the zener diode 384. The trailing edge of alternate pulses coincides with the leading edge of the self-check pulses C2 which, as described above, coincides with the leading edge of the A1 pulses as established by the reference level of comparator 240. (This reference level is chosen to be slightly higher than the clipping level of the zener diode 384 so that in case triac 26 does not close the D1 pulse remains logical high through the duration of pulse C2. This assures that no part of the pulse C2 propagates through NOR gate 374 via NAND gate 366 thus giving an erroneous indication of a good check on triac 26.)

A pulse-duty cycle responsive circuit 394 including a transistor 392 is provided for self-checking purposes. The signal on NOR gate output terminal 388 is applied through a resistor 390 to the base of the transistor 392. The emitter terminal of the transistor 392 is connected to ground and the collector terminal is connected through a resistor 396 to the 15 volt regulated supply terminal 32. A resistor 400 and capacitor 398 are connected in series across the resistor 396. Similarly, a resistor 404 and diode 402 are connected in series across the resistor 400. A capacitor 406 is connected across the resistor 404 and has its lower terminal connected to node 407. The output signal D3 of the pulse-duty cycle responsive circuit 394 is derived at node 407 and is applied as one input to a NOR gate 410.

The operation of the pulse-duty cycle responsive circuit 394 is as follows. In normal operation, the pulses into the base of transistor 392 correspond in pulse duration to the self-check pulse C2 (about 100 microseconds) which has a duty cycle much less than 25 percent (25 percent is the maximum duty cycle for which D3 still remains logical low for all CMOS inputs). When transistor 392 is turned on for the duration of the self-check pulse C2, the supply voltage is divided across capacitors 406 and 398. Capacitor 398 is much larger (about 50 times) than capacitor 406. Consequently, only a small part (approximately 0.3 volts) of the supply voltage appears across capacitor 398. The added increment of voltage due to changing current through resistors 404 and 400 is negligible since the time to charge capacitor 398 through resistor 400 is much greater than the duration of C2. During the self-check pulse C2, the signal D3 at node 407 is the voltage across capacitor 398 plus the forward drop (about 0.6 volts) across the diode 402. This value of D3 (about 1 volt) is much less than the maximum value of a logical low voltage. Between self-check pulses C2, capacitor 398 discharges to approximately zero volts through resistors 396 and 400. During the time between self-check pulses C2, the diode 402 is reverse biased and capacitor 406 can only discharge through resistor 404 which discharge time is much greater than the time between pulses C2. As a result, the voltage at node 407 does not change much between the self-check pulses C2 and the signal D3 remains at a logic low voltage for normal operation.

However, in the event that the output of NAND gate 366 should fail in a logic low condition, the NOR gate 374 will produce output pulses corresponding to the self-check detection signal D1. These pulses have a duty cycle of about 50 percent. With this pulse input to transistor 392, the pulse-duty cycle responsive circuit 394 will produce a signal D3 which is logical high. This result is obtained since capacitor 398 has charging and discharging periods which are about equal but the capacitor is charged through resistor 400 alone and is discharged through both resistors 396 and 400 generating a time average voltage of 10 volts at the cathode of 402. An equilibrium condition is reached in which the voltage at node 407 is held at a value of about 10.6 volts. Thus, for this abnormal condition the signal D3 is at logic high.

The NOR gate 410, produces a self-check turn-on signal T1 for the gate driver 52. One input terminal 412 of NOR gate 410 receives the input signal C1 on conductor 342 from the line synchronized gate pulse generator 60. The other input terminal 414 receives the output signal D3 of the pulse-duty cycle responsive circuit 394. The NOR gate output, i.e. the self-check turn-on signal T1 appears at the output terminal 416.

The operation of the turn-on detector 56 is as follows. The NAND gate 366 is operative, so long as the pulses of signal E2Q/ are applied to node 360, to invert the self-check pulse C2 and apply them to the input 376 of NOR gate 374. The diode 358, resistor 362 and capacitor 364 are operative to rectify and filter the signal E2Q/ and produce a constant logical high voltage at node 360. This holds the NAND gate 366 open and it thus inverts pulses C2. If E2Q/ fails low, gate 366 at output 372 goes logical high shutting off transistor 392 and allowing capacitor 406 to discharge through resistor 404 forcing signal D3 high and blowing the fuse by turning transistor 440 on. If E2Q/ fails high input to gate 366, 368 goes low shutting off transistor 392 and again causing transistor 440 to blow the fuse. If the self-check detection signal D1 is low during the self-check pulse C2, the output 388 of NOR gate 374 will go high for a time equal to the width of the self-check pulse, i.e. 100 microseconds. This will turn on transistor 392 for the duration of the self-check pulse. If transistor 392 is turned on repeatedly by an uninterrupted train of self-check pulses, the output signal D3 of pulse-duty cycle responsive circuit 394 is low and the input terminal 414 of NOR gate 410 is held at logic low. In this condition, the self-check pulses C1 on input 412 causes the self-check turn on signal T1 at the output 416 of the NOR gate 410 to go low with each pulse. This logic low output of the NOR gate 410 is applied to the gate driver 52 which, as will be described subsequently, turns on the triac 24.

Triac 24 turns off approximately 200 μs after the conclusion of C1, at zero current crossing through the triac. This zero current crossing occurs nearly simultaneously with the positive-to-negative zero voltage crossing of the line because the load is almost purely resistive (resistor 90). Inductors 62 and 64 add little current retard due to their small values. This momentary conduction of triac 24 causes the voltage at node A to go to logic low during triac conduction on alternate cycles of the line voltage as long as triac 24 is turning on properly. A similar self-check turn-on signal is developed in the same manner by the turn-on detector 58 which causes triac 26 to be turned on momentarily by the self-check pulse C2, as will be described subsequently. Consequently, when the triac 26 is turned on by the self-check pulse C2 the node B and the self-check detection signal D1 go to logic low. The signal D1 is applied from the node 382 through conductor 386 to the input terminal 378 of the NOR gate 374. As stated above, this causes the transistor 392 to be turned on for the duration of each self-check pulse C2. When transistor 392 is turned on repeatedly at the duty cycle of the self-check pulses C2 the signal D3 at the output of the pulse-duty cycle responsive circuit on terminal 414 of NOR gate 410 is held at logic low. Thus, as long as triac 26 continues to turn on properly in response to self-check signal C2, the self-check signal C1 will be applied to triac 24. However, if triac 26 is not turning on properly in response to the self-check pulse C2 the node B will be at logic high during the self-check pulse and transistor 392 will not be turned on. Consequently the signal D3 at input terminal 414 goes to logic high which causes the self-check turn on signal T1 at output terminal 416 thereof to go to logic low. This is effective to cause the gate driver 52, as will be described subsequently, to produce a continuous turn-on signal for the triac 24 which short circuits the load and blows the fuse.

The circuit of turn-on detector 58 is the same as that of turn-on detector 56. The turn-on detector 58 includes a NAND gate 450 which has an input terminal 452 connected to node 352, an input terminal 456 which receives the signal C1 and an output terminal 458.

The NAND gate 450 is operative, so long as the pulses of signal E2Q are applied to node 352, to invert the self-check pulses C1 and apply them to the input 462 of NOR gate 460. The diode 350, resistor 354 and capacitor 356 are operative to rectify and filter the signal E2Q and produce a constant logical high voltage at node 352. This holds the NAND gate 450 open and it thus inverts pulses C1. The NAND gate output signal appears on terminal 458. A NOR gate 460 has one input terminal 462, another input terminal 464 and an output terminal 474. The input terminal 462 receives the output signal from NAND gate 450. A zener diode 472 is connected between the node 468 and ground. The self-check detection signal D2 is derived at node 468 and is applied to NOR gate input terminal 464. The signal, as shown in FIG. 3, is a series of pulses derived from the line voltage across zener diode 472. Its leading and trailing edges are as described above with reference to signal D1.

The turn-on detector 58 has a pulse-duty cycle responsive circuit 480 including a transistor 478. The output signal of NOR gate 460 is applied through a resistor 476 to the base of the transistor 478. The transistor emitter terminal is grounded. The collector terminal is connected to the 15 volt regulated supply terminal 32 through a resistor 482. A resistor 484 is connected in series with capacitor 486 across resistor 482. A resistor 488 is connected in series with a diode 490 across the resistor 484. A capacitor 492 is connected across the resistor 488. The output signal D4 of the pulse-duty cycle responsive circuit 480 is derived at the node 493 and is applied as one input to a NOR gate 496.

The NOR gate 496 produces a self-check turn on signal T2 for the gate driver 54. One input terminal 500 of NOR gate 496 receives the self-check signal C2. The input terminal 498 receives the output signal D4 of the pulse-duty cycle responsive circuit 480. The NOR gate output signal i.e. self-check turn on signal T2 appears on terminal 502.

The turn-on detector 58 operates in the same manner as turn-on detector 56 described above. In brief, if triac 24 is turning on properly in response to self-check signal C1, the turn-on detection signal D2 goes low repeatedly and, through NOR gate 460, repeatedly allows C1/ from output 458 of NAND gate 450 to turn on transistor 478 of the pulse-duty cycle responsive circuit 480. This holds the signal D4 low at NOR gate 496 and the self-check turn-on signal T2 goes low with each C2 pulse. The signal T2 is applied to the gate driver 54. However, if triac 24 does not turn-on properly in response to the self-check pulses, the signal D4 to NOR gate 496 goes high and the output thereof is held low. This causes the gate driver 54, as described subsequently, to hold the triac 26 turned on which short circuits the load and blows the fuse.

The Signal Developing Circuits

The signal developing circuits 550 and 552 referred to in connection with FIG. 1, are shown in schematic diagram in FIG. 2D. As previously described, the relay control switch 40 is part of an electronic intrusion detector and is connected with the inputs of the signal developing circuits 550 and 552. The purpose of these circuits is to selectively produce a relay closing signal, i.e. a signal for closing main triac 20, and a relay opening signal, i.e. a signal for opening the main triac 20. As discussed above, when the main triac 20 is closed, the self-check triacs 24 and 26 are open and vice versa. The switching of the self-check triacs 24 and 26 is in controlled time-relation with the switching of main triac 20; it is important to ensure that the main triac and the self-checking triacs are not in the closed condition at the same time because the fuse 18 would be blown even though there is no fault. Accordingly, the signal developing circuits 550 and 552 are provided to ensure that a relay closing signal from the switch 40 causes the self-check triacs 24 and 26 to open before the main triac 20 is closed and that a relay opening signal from the control switch 40 causes the main triac 20 to open slightly before the self-check triacs 24 and 26 close.

In general, the control switch 40 is adapted to apply a logic high or logic low voltage to the inputs of the signal developing circuits. The switch 40 is connected in series with a resistor 135 across the regulated supply voltage at the terminal 32 of the power supply. The signal developing circuit 550 extends between the ungrounded terminal of the resistor 135 and the main triac driver 38 (see FIG. 2B); the signal developing circuit 552 extends between the ungrounded terminal of resistor 135 and the self-check drivers 52 and 54.

The signal developing circuit 550 is adapted to develop a control signal S1 for main triac gate driver 38 in response to a relay closing or relay opening signal from the control switch 40. The signal developing circuit 550 comprises a resistor 554 connected between the ungrounded terminal of resistor 135 and the input terminal 132 of the AND gate 128 (FIG. 2B) in the main triac driver 38. A diode 558 is connected in parallel with resistor 554, with its cathode connected to the ungrounded terminal of the resistor 135. A capacitor 556 is connected between the anode of diode 558 and ground. The control signal S1 is developed across the capacitor 556 in the following manner: when the control switch 40 is open to produce a relay opening signal, the capacitor 556 is discharged through the diode 558 and the resistor 135 to ground and the signal S1 is at logic low. When the control switch 40 is closed, the supply voltage of 15 volts at terminal 32 is supplied through the resistor 554 to the capacitor 556 and the capacitor charges at a rate determined by the values of the resistor and the capacitor. After a controlled timed delay, the signal S1 reaches a logic high value. This time delay is correlated with the timing of the signal developing circuit 552 to ensure that the main triac 20 is turned on slightly after the self-check triacs 24 and 26 are turned off. When the control switch 40 is opened to produce a relay opening signal, the capacitor 556 discharges through the diode 558 and resistor 135 to ground causing the signal S1 to go to logic low after a predetermined time delay. The resistor 554 is greater, by a factor of more than 100, than the resistor 135 and consequently the time constant of the charging circuit is greater than that of the discharging circuit for the capacitor 556. As a result, the time delay in producing a logic high control signal S1 is significantly longer than the time delay in producing a logic low control signal after the actuation of the switch 40. The manner in which these time delays are correlated with the timing of the signal developing circuit 552 will be described subsequently.

The signal developing circuit 552 is adapted to develop a control signal S2 in response to a relay closing or relay opening signal from the control switch 40. The control signal S2 is applied to the input of the self-check drivers 52 and 54. The control signal S2 goes from logic low to logic high and vice versa with controlled time delays which are correlated with time delays in the transitions of control signal S1, as will be described subsequently.

In order to ensure that proper timing will be achieved, a comparator 560 is employed in the signal developing circuit 552, instead of a simple time constant network such as the signal developing circuit 550. This is done for the reason that the AND gates 418 and 504 of the self-check triac drivers 52 and 54 are preferably CMOS circuits which typically have input thresholds which vary from device to device over a range of about 4 to 11 volts. Because of this variation, a time constant circuit would have to interpose an unduly long time delay before turning on the self-check triacs 24 and 26. It is important to note that whenever a relay opening signal is applied, the control signal S1 for the main triac gate driver 38 drops to logic low almost immediately but the main triac does not open until the first zero current crossing. This may not occur until one-half cycle (of the supply voltage) later and, at a supply frequency of 60 Hz, this is 8.3 milliseconds. Now, if the signal developing circuit 552 were to use a time constant network, the time constant would have to be high enough so that at least 8.3 milliseconds would lapse between the time of the relay opening signal (opening of switch 40) and the time that the voltage at inputs 422 and 508 of AND gates 418 and 504 drop to 11 volts, the higher limit in the range of threshold variation for these gates. This would interpose a time lapse of about 62 milliseconds before the voltage would decrease to 4 volts, the lower limit in the range of threshold variation. If the main triac 20 fails to open the relay will not disconnect the load 14 until the self-check triacs 24 and 26 are turned on and the fuse 18 is blown. This 62 milliseconds delay is unacceptable for producing an emergency machine stop in a safeguarding system.

Accordingly, the signal developing circuit 552 utilizes the comparator 560 for developing the signal S2 so that it will occur in precise timed relationship with the transitions in signal S1. In particular, the circuit 552 is adapted to cause signal S2 to go to logical low approximately 10 milliseconds after signal S1 goes to logical low. This ensures that, in the event of a relay opening signal, the self-check triacs will not be closed before the latest possible turn off time for the main triac, i.e. before the current in the main triac goes through a zero current crossing. Without this provision, the fuse 18 might be blown unnecessarily. This arrangement turns on the self-check triacs without undue delay after the zero current crossing of the main triac. In the event the main triac fails to open, the fuse will begin to be blown 10 milliseconds after the relay opening signal.

The signal developing circuit 552 comprises the comparator 560 which receives a reference voltage at its inverting input terminal 562, and an input voltage at its non-inverting input 564. When the input voltage at 564 is less than the reference voltage, the output signal S2 at terminal 566 is at logic low. When the input voltage is equal to or greater than the reference voltage the signal voltage S2 goes to logic high. In the signal developing circuit 552, a resistor 568 is connected in series with a capacitor 570 between the ungrounded terminal of resistor 135 and ground. A diode 572 and a resistor 574 are connected in series across the resistor 568. It is noted that the diode 572 is poled with its anode connected to the ungrounded terminal of resistor 135. The voltage across the capacitor 570 is applied through a resistor 576 to the non-inverting input of the comparator 560. A resistor 578 is connected between the input terminal 564 and the output terminal 566 of the comparator. In order to develop the reference voltage, a pair of resistors 580 and 582 are connected in series between the terminal 32 of the regulated voltage source and ground. A capacitor 584 is connected in parallel with the resistor 582 and the node thereof is connected to the inverting input terminal 562 of the comparator. A pull-up resistor 588 is connected between the output terminal 566 of the comparator and the terminal 32 of the voltage source. The output terminal 566 of the comparator is connected through a conductor 590 to the input of the self-check driver 52 and to the input of the self-check driver 54.

It is noted that the input signal for the comparator 560 is developed across the capacitor 570. When the control switch 40 is closed to produce a relay closing signal, the capacitor 570 is charged through the diode 572 in series with resistor 574 and through the parallel resistor 568. When the control switch 40 is open to produce a relay opening signal, the capacitor 570 discharges through the resistor 568 and the resistor 135 to ground. The voltage at input 564 of comparator 560 will decrease to a value equal to the reference voltage at input 562 in about 10 milliseconds. It is noted that the resistor 568 is many times larger than the resistor 574, by a factor of more than 100, so that the time constant of the discharging circuit is many times greater than that of the charging circuit. Accordingly, the control signal S2 will go from logic low to logic high (in a fraction of a millisecond) in response to a relay closing signal much faster than it goes from logic high to logic low in response to relay opening signal.

Further, in connection with the timing of the control signals S1 and S2, it is noted that the charging time constant of resistor 554 and capacitor 556 is several times greater, by factor of more than 100, than the charging time constant of the parallel resistors 574 and 568 with capacitor 570. Accordingly, control signal S2 goes to logic high for turning off the self-check triacs 24 and 26 before the control signal S1 goes to logic high for turning on the main triac 20. Also, it is noted that the discharge time contant of the capacitor 570 and resistor 568 and resistor 135 is several times greater than the discharge time constant of the capacitor 556 and resistor 135 in the signal developing circuit 550. Accordingly, as described above, when a relay opening signal is produced by the control switch 40, the control signal S1 for the main triac 20 will go from logic high to logic low without appreciable time delay; the control signal S2 for the self-check triacs 24 and 26 goes from logic high to logic low in a time period of about 10 milliseconds as controlled by the comparator 560. Thus, the main triac 20, in the normal operating condition is opened slightly before the self-check triacs 24 and 26 are closed, as described above, to avoid inadvertent blowing of the fuse. However, since the main triac does not open until the first zero crossing of the current through it after the control signal S1 on its gate goes to logic low, it is desirable to minimize the time delay by which the control signal S1 goes to logic low after the control switch 40 is opened. This will avoid any undue delay in interrupting the relay-controlled circuit and stopping of the press in case of an alarm signal.

The Self-Check Triac Gate Drivers

The gate drivers 52 and 54 receive the self-check turn-on signals T1 and T2 from the turn-on detectors 56 and 58, respectively, and they also receive the control signal S2 for switching the triacs 24 and 26.

The gate driver 52 comprises an AND gate 418 and a transistor 440. The AND gate 418 has one input terminal 420 which receives the self-check turn-on signal T1 from NOR gate 410. The input terminal 422 receives control signal S2 from the signal developing circuit 552. The AND gate output signal on terminal 436 is applied through a resistor 438 to the base of the transistor 440. The emitter terminal of the transistor 440 is connected through a resistor 444 to the 10 volt unregulated supply terminal 34. The transistor base terminal is connected through a zener diode 442 to the supply terminal 34. The collector of the transistor is connected through conductor 49 to the gate 48 of the triac 24 in the manner previously described. When either signal S2 or T1 is logic low, the output of the AND gate 418 is low, transistor 440 is conductive, and turn-on current is supplied to the gate 48 of the triac 24 to turn on the triac. As described above, the control signal S2 is low when the control switch 40 is open which produces a relay opening signal. The self-check turn on signal T1 is low concurrently with self-check pulses C1 and hence the triac 24 is turned on with each pulse T1.

The gate driver 54 is the same as gate driver 52. It includes an AND gate 504 which has one input terminal 506 which receives the self-check turn-on signal T2 from the NOR gate 496. The other input terminal 508 receives the control signal S2 from the output of the signal developing circuit 552 at the output 566 of the comparator 560. The AND gate output signal at terminal 512 is applied to the base terminal of a transistor 516 through a resistor 514. The transistor emitter terminal is connected through a resistor 520 to the 10 volt unregulated supply terminal 34. The terminal 34 is also connected through a zener diode 518 to the base terminal. The collector of the transistor is connected through a conductor 51 to the gate 50 of the triac 26. When either signal S2 or T2 or both are low, the output of AND gate 504 is low and the transistor 516 is turned on, and turn-on current is supplied to the gate 50 of the triac. Thus, the driver 54 is operative to periodically turn on the triac 26 by the signal T2 for self-checking purposes or to turn it on continuously when the switch 40 is open.

Operation

The operation of the relay will now be described. In general, the relay will operate to selectively switch the control circuit 10 between on and off conditions, i.e. to selectively provide circuit closing and circuit opening. When the circuit is closed, the solenoid valve 14 can be energized and the machine (punch press) can be operated; when the control circuit is opened, the solenoid valve 14 is deenergized and the machine is stopped. The relay provides the circuit closing and the circuit opening between the relay load terminals 4 and 6. The relay receives a control signal for relay closing or relay opening on its input terminal 8. As discussed above, an electronic intrusion detector, represented by switch 40, produces a relay control signal. When the switch 40 is closed it produces a logic high or relay closing signal for energizing the machine control circuit so the solenoid valve 14 can be energized. When the switch 40 is open, it produces a logic low control signal or relay opening signal for deenergizing the solenoid valve 14 to stop the machine.

When the manual control switch 16 is closed, the power supply 30 is energized and a regulated voltage source supplies 15 volts on terminal 32 and an unregulated voltage source supplies 10 volts on terminal 34. These two voltage sources supply power to all the other stages of the relay. The power up delay circuit 44 operates to prevent the main triac 20 from being turned on until the self-check triacs have been turned off. About 100 milliseconds after the manual switch 16 has been closed, the output of the power up delay circuit 44 on terminal 186 goes high and thereby enables the AND gate 120 of the main triac driver 38 to transmit pulses from the pulse generator 42.

If the control switch 40 is open at the time the manual switch 16 is closed, the control signal S1 at the input terminal 132 of the AND gate 128 will be low and the output of the AND gate will be low. Accordingly, the driver transistor 144 will be turned off and hence there will be no gate current to the main triac 20 and the triac will be open. Accordingly, the solenoid valve 14 will not be energized and the machine will not start. During this condition, after the relay is powered up, but before the relay is closed, the relay will function to perform self-checking as will be described subsequently. In this condition, the control signal S2 will be low. This will cause the outputs of AND gates 418 and 504 to be low and hence the driver transistors 440 and 516 will be kept on. This will supply gate current to the self-check triacs 24 and 26, respectively, keeping them on.

When the control switch 40 is closed, the control signal S2 at the output of the signal developing circuit 552 goes high and turns off the driver transistors 440 and 516 which, in turn, turns off the self-check triacs 24 and 26, respectively. After a short time delay, the control signal S1 from the signal developing circuit 550 goes high and enables the AND gate 128 in the main triac driver 38. With the AND gate 128 enabled, the pulses from the generator 42 are supplied to the driver transistor 144 switching it on and off at the frequency of the pulses. This supplies current pulses through the pulse transformer 154 to the gate of the main triac 20 holding the main triac in the closed state. Thus, the solenoid valve 14 is energized and the machine is started. During this operating condition of the relay and the machine, the relay performs self-checking, as will be described below.

In the event that there is an intrusion into the guarded zone of the machine, as detected by the electronic intrusion detector, the control switch 40 is thereby opened. When the switch 40 is opened, the control signal S1 quickly goes low and the AND gate 128 is disabled. With the AND gate disabled, the transistor 144 is turned off and the current pulses to the gate of main triac 20 are turned off and the main triac is opened. Opening of the control switch 40 also causes the control signal S2 to go low a short but accurate time delay after the control signal S1 goes low. Accordingly, the driver transistors 440 and 516 are turned on and the self-checking triacs 24 and 26 are turned on. When the main triac 20 is opened, the solenoid valve 14 is deenergized and the machine is stopped.

In the event that the control switch 40 is opened as aforesaid, and in the further event that the main triac 20 fails in the closed condition, the control signals S1 and S2 go low as described above and the driver transistor 144 will be turned off and the driver transistors 440 and 516 will be turned on. Accordingly, the self-check triacs 24 and 26 will be turned on providing a bypass or short circuit around the solenoid valve 14. The low impedance path through the main triac 20 in its closed state, the parallel self-check triacs in their closed states, and the low value resistors 90 and 92 draws a high current through the fuse 18, sufficient to quickly blow the fuse. This interrupts the control circuit and deenergizes the solenoid valve 14 which stops the machine. The blown fuse latches the solenoid valve 14 in the deenergized state and the machine cannot be restarted without the intervention of supervisory personnel authorized to replace the fuse. Thus, the malfunction of the main triac 20 in the closed state is a fail-safe operation of the relay.

During the time that the relay is powered up, whether or not the control switch 40 is opened or closed, the relay performs self-checking on all of the circuits of the relay. First the self-checking of the self-check triacs 24 and 26 will be described. Reference is made to the timing diagram of FIG. 3. When the control switch 40 is closed, the main triac 20 is closed and the self-check triacs 24 and 26 are held open by the gate drivers 52 and 54, respectively, as described above. In this condition, self-checking of the triacs 24 and 26 is performed in order to ascertain whether they are operative to be turned on and thereby perform their fail-safe function in the event that any fault is detected by other self-checking or in the event that the main triac 20 fails to open in response to a relay opening signal from the control circuit. With the switch 40 closed, the control signal S2 is high, the AND gates 418 and 504 are enabled and the self-check pulses C1 and C2 are propagated through the respective gates 418 and 504. As indicated in FIG. 3, the self-check pulse C1 occurs just prior to the negative-going zero crossing of the supply voltage on one cycle thereof and the self-check pulse C2 occurs just prior to the negative-going zero crossing of the next cycle of supply voltage. Assuming that the signal D3 at the NOR gate 410 is low, the self-check pulses C1 are inverted by the NOR gate 410 and each pulse at the terminal 420 of AND gate 418 causes the AND gate output to go low for 100 microseconds. This closes the self-check triac 24 during each self-check pulse C1 just prior to zero voltage crossing and it remains closed for the remainder of the cycle of supply voltage. This causes the voltage at node A of self-check triac 24 to go low (actually equal to the on-state voltage of the triac of about 1 volt). Thus, the self-check detection signal D2 across the zener diode 472 goes low in response to the self-check pulse (see FIG. 3) and the input terminal 464 of NOR gate 460 goes low. The inverted self-check pulse C1/ from the NAND gate 450 is applied to the other input terminal of the NOR gate 460. This turns on transistor 478 repeatedly and holds the output signal D4 of pulse-duty cycle responsive circuit 480 at logic low. This allows the self-check pulses C2 to propagate through gates 496 and 504 to close triac 26 just prior to negative-going zero voltage crossing and it remains closed during the remainder of the cycle of supply voltage. Thus the signal D1 across the zener diode 384 goes low during this self-check pulse C2 and the transistor 392 is repeatedly turned on. This holds the signal D3 low at the input of NOR gate 410 in accordance with assumption stated above.

If the self-check triac 24 fails to turn-on in response to the self-check pulses C1, the signal D4 from the pulse-duty cycle responsive circuit 480 will go high. This causes the output signal T2 of NOR gate 496 to go low and the AND gate 504 turns on the transistor 516. This keeps the self-check triac 26 closed which blows the fuse and deenergizes the solenoid valve 14 and stops the machine. If triac 26 fails to turn on in response to the self-check pulses C2, the output of the NOR gate 410 will go low and the transistor 440 will be held on keeping the self-check triac 24 closed and blowing the fuse. This deenergizes the solenoid valve 14 and stops the machine.

Self-checking of the other components of the relay are performed as follows. If the output of AND gate 418 should fail in a logic low state, the self-check triac 24 is held closed and the fuse is blown. If the output of the AND gate 418 floats or fails in a logic high state, the self-check pulses C1 will not close the self-check triac 24. This will be detected by the turn-on detector 58 and self-check triac 26 will be closed blowing the fuse. If anything in the circuit of the relay causes the AND gate 418 to go low, high or float as just described, such as failure of NOR gate 324, transistor 516 or self-check triac 26, the result will be the same as if AND gate 418 had failed. In the same manner, a failure of AND gate 504 or any of the circuitry which causes the output of AND gate 504 to stay high, low or floating will also blow the fuse.

If flip-flop 290 stops putting out pulses and the signal E1 stays high, the self-check triacs 24 and 26 are not pulsed through the respective NOR gates 410 and 496 and the turn-on detectors 56 and 58 do not receive the pulses of signals D1 and D2. Accordingly, the input terminal 414 of NOR gate 410 and the input terminal 498 of NOR gate 496 go to logic high and the fuse is blown. If the signal E1 stays at logic low, the pulses E2Q and E2Q/ from flip-flop 300 keep the self-check triacs 24 and 26 on alternately for one complete cycle of the line voltage. This is equivalent to one being on continuously as far as the current through the fuse is concerned and this causes the fuse to blow.

If flip-flop 300 stops alternating with one of the output signals E2Q or E2Q/ failing high and the other low, the high output causes its respective NOR gate 324 or 332 to close and the corresponding self-check pulse C1 or C2 is no longer generated. As a result, the self-check triac, 24 or 26, is not pulsed and the corresponding turn-on detector 56 or 58 closes the other self-check triac and blows the fuse. If both output signals E2Q and E2Q/ fail in a logic low state the input terminal 370 of NAND gate 366 and the input terminal 452 of NAND gate 450 go to logic low and the NOR gates 374 and 460 are closed so that the pulses D1, D2, C1 and C2 do not get through to the turn-on detectors 56 and 58. As a result both self-check triacs 24 and 26 are closed and the fuse is blown.

If NOR gate 374 or transistor 392 fails either logic high or logic low D3 goes logic high, the output of NOR gate 410 will be held at logic low and transistor 440 will be held on, blowing the fuse. Same applies to NOR gate 460 and transistor 478.

If either of the NAND gates 366 or 450 fails with its output in a logic high state, the respective NOR gate 374 or 460 is closed to the pulses D1 and D2 and the turn-on detectors 56 and 58 close the self-check triacs 24 and 26, blowing the fuse. If either NAND gate 366 or NAND gate 450 fails with its respective output in a logic low state, the waveforms at the input 378 of NOR gate 374 or at the input 464 of NOR gate 460 which have a duty cycle of about 50%, causes the voltages at input terminal of NOR gate 410 or input terminal 498 of NOR gate 496 to go to logic high which closes the self-check triacs and blows the fuse.

If the pulse generator 42 for the main triac 20 stops generating pulses, and fails with its output in either a logic high or logic low state or if AND gate 128 fails with its output in either a logic high or a logic low state or if transistor 144 fails no pulses will be applied to the pulse transformer 154 and the main triac 20 will open. This, of course, deenergizes the solenoid valve 14 and stops the machine.

COMPONENTS

The illustrative embodiment of the invention described above has been implemented with components identified in the following table. It is to be understood that this embodiment is adapted for a specific application and that the component values are typical for such an application. The component values and specific circuits are given for the purpose of disclosing the best known mode for carrying out the invention and not for purposes of limitation. In the table below, the components are grouped under selected headings of particular circuits for convenience of locating a given component; such groupings are not to be construed as any form of definition of the different circuits. It will be understood that other circuits and other components will be required for implementing the invention for other applications.

| Press Control Circuit 10: | |
|---|---|
| Control transformer 12 | Isolation, 5 Amp |
| Control circuit fuse 13 | None |
| Solenoid valve 14 | Ross Mod. 357B3026 Ross Valve, Detroit, Michigan |

| Switching Circuit: | |
|---|---|
| Triac 20 | 2N6152 |
| Triac 24, 26 | 2N6152 |
| Fuse 18 | GBB-3 |
| Resistors 90, 92 | 10 ohms, 2 W |

| Snubber Circuit 28: | |
|---|---|
| Inductors 62, 64, 78, 80 | 500 μH |
| Capacitors 68, 76, 82, 84 | 0.1 μf |
| Resistors 66, 74 | 100 ohms |
| Varistors 70, 72 | GMOV (130 V, 10 joules) |

| Powder Supply 30: | |
|---|---|
| Transformer 101 | Signal ST4-16 |
| Bridge rectifiers 108, 116 | MDA 200 |
| Capacitor across bridge 108 | 400 uf |
| Capacitor across bridge 116 | 1500 uf |
| Transistor 110 | MPS A13 |
| Zener diode 114 | 16 V |
| Resistor 112 | 47 k ohm |

| Main Triac Gate Driver 38: | |
|---|---|
| AND gates 120, 128 | MC14081B |
| Resistor 142 | 18 k ohms |
| Resistor 150 | 33 ohms, ½ W |
| Diode 146 | 1N914 |
| Zener diode 148 | LVA 51A |
| Transistor 144 | MPS A13 |
| Pulse transformer 154 | Sprague 66Z906 |

| Pulse Generator 42: | |
|---|---|
| Comparator 160 | MLM 339 |
| Capacitor 172 | 200 pf |
| Resistor 168 | 100 k ohms |
| Resistor 170 | 100 k ohms |
| Resistor 174 | 10 k ohms |
| Resistor 176 | 100 k ohms |
| Resistor 178 | 100 k ohms |

| Power Up Delay Circuit 44: | |
|---|---|
| Comparator 180 | MLM 339 |
| Resistor 204 | 100 k ohms |
| Resistor 206 | 47 k ohms |
| Resistor 210 | 10 k ohms |
| Resistor 212 | 1 M ohms |
| Resistor 198 | 100 k ohms |
| Resistor 194 | 1.5 k ohms |
| Capacitor 208 | 1000 pf |
| Capacitor 202 | 1 uf |
| Capacitor 196 | 10 uf |
| Diode 200 | 1N914 |

-continued

| Power Up Delay Circuit 44: | |
|---|---|
| Diode 188, 190 | 1N4001 |

| Gate Pulse Generator 60: | |
|---|---|
| Comparators 240, 260 | MLM 339 |
| Flip-Flops 290, 300 | MC14013B |
| NOR gates 324 332 | MC14001B |
| Resistor 222 | 68 k ohms |
| Resistor 224 | 10 k ohms |
| Resistor 228 | 4.7 k ohms |
| Resistor 234 | 3.9 k ohms |
| Resistor 248 | 18 k ohms |
| Resistor 250 | 8.2 k ohms |
| Resistor 252 | 120 k ohms |
| Resistor 254 | 3.3 k ohms |
| Resistor 256 | 10 M ohms |
| Resistor 268 | 33 k ohms |
| Resistor 274 | 3.3 k ohms |
| Resistor 276 | 47 k ohms |
| Resistor 280 | 47 k ohms |
| Resistor 282 | 10 k ohms |
| Resistor 284 | 10 M ohms |
| Resistor 312 | 47 k ohms |
| Resistor 318 | 47 k ohms |
| Capacitor 238 | 1000 pf |
| Capacitor 272 | .005 uf |
| Capacitor 316 | 100 pf |
| Capacitor 322 | 100 pf |
| Diode 232 | 1N914 |

| SCT A and SCT B Turn On Detectors 56, 58: | |
|---|---|
| NAND gates 366, 450 | MC14011B |
| NOR gates 374, 460 | MC14001B |
| NOR gates 410, 496 | MC14001B |
| Transistors 392, 478 | 2N3415 |
| Resistors 390, 476 | 10 k ohms |
| Resistors 396, 482 | 10 k ohms |
| Resistors 400, 484 | 10 k ohms |
| Resistors 404, 488 | 2.2 M ohms |
| Capacitor 398, 486 | 50 uf |
| Capacitor 406, 492 | 1 uf |

| SCT A and SCT B Gate Drivers 52, 54: | |
|---|---|
| AND gates 418, 504 | MC14081B |
| Resistors 438, 514 | 18 k ohms |
| Resistors 444, 520 | 33 ohms, 1 W |
| Transistors 440, 516 | MPSA63 |
| Zener diodes 442, 518 | LVA 51A |

| Interstage Components (FIG. 2D): | |
|---|---|
| Diodes 350, 358 | 1N914 |
| Resistors 354, 362 | 1 M ohms |
| Resistors 470, 380 | 56 k ohms |
| Capacitors 356, 364 | 0.1 uf |
| Zener diode 472, 384 | 1N964B |

| Signal Developing Circuit 550: | |
|---|---|
| Resistor 554 | 333 k ohms |
| Capacitor 556 | 0.1 uf |
| Diode 558 | 1N914 |
| Resistor 135 | 18 k ohms |

| Signal Developing Circuit 552: | |
| --- | --- |
| Comparator 560 | MLM 339 |
| Resistor 568 | 240 k ohms |
| Resistor 574 | 1.8 k ohms |
| Resistor 580 | 47 k ohms |
| Resistor 582 | 47 k ohms |
| Resistor 576 | 6.8 k ohms |
| Resistor 578 | 10 M ohms |
| Resistor 588 | 10 k ohms |
| Capacitor 570 | 0.1 uf |
| Capacitor 584 | 1000 pf |
| Diode 572 | 1N914 |

Although the description of this invention has been given with reference to a particular embodiment, it is not to be construed in a limiting sense. Many variations of modifications of the invention will now occur to those skilled in the art. For a definition of the invention reference is made to the appended claims.

What is claimed is:

1. A relay circuit for switching an electrical load comprising a main triac having a pair of main terminals and a gate terminal, said main terminals being adapted to be connected in series with the load and an electric power source, a secondary triac having a pair of main terminals and a gate terminal, the main terminals of the secondary triac being adapted to be connected in parallel with said load, a current responsive circuit breaker connected in series with the main triac, a control circuit including a control switch for selectively producing a relay closing signal or a relay opening signal, first signal developing means operatively coupled between the control switch and the gate terminal of the main triac for turning on said main triac in response to a relay closing signal and for turning it off in response to a relay opening signal, a main triac gate driver coupled between said first signal developing means and the gate terminal of said main triac, a signal pulse generator, said gate driver having first logic means with a first input coupled with said first signal developing means and having a second input coupled with said pulse generator for producing a main triac turn-on signal in response to a relay closing signal and main triac turn-off signal in response to a relay opening signal, and a second signal developing means operatively coupled between the control switch and the gate terminal of the secondary triac for turning off the secondary triac in response to a relay closing signal and for turning the secondary triac on in response to a relay opening signal whereby the load will be deenergized by short-circuiting through the secondary triac and opening of said circuit breaker in the event that said main triac fails to turn off in response to a relay opening signal.

2. The invention as defined in claim 1 wherein said main triac gate driver includes a driver transistor and a pulse transformer coupled between the output of the first logic means and the gate terminal of the main triac.

3. The invention as defined in claim 1 including self-checking means, a self-check gate driver coupled between said second signal developing circuit and the gate terminal of said secondary triac, said self-check gate driver having second logic means with a first input coupled with the self-check means and a second input coupled with the second signal developing circuit.

4. The invention as defined in claim 3 wherein said first logic means is responsive to a relay closing or a relay opening signal to operatively connect or disconnect, respectively, the output of said pulse generator to said main triac gate driver to respectively turn on or turn off said main triac and wherein said second logic means is responsive to a relay closing or relay opening signal to respectively turn off or turn on said secondary triac.

5. The invention as defined in claim 4 wherein said first signal developing means includes a first timing circuit and wherein said second signal developing means includes a second timing circuit, said timing circuits being operative to delay the turn-on of the main triac until after said secondary triac is turned off and to delay the turn-on of the secondary triac until after the main triac is turned off.

6. The invention as defined in claim 3 including an additional secondary triac having a pair of main terminals and a gate terminal, the main terminals of the additional secondary triac being connected in parallel with the main terminals of the first mentioned secondary triac, an additional self-check gate driver coupled between the second signal developing means and the gate terminal of the additional secondary triac, said additional self-check gate driver having a third logic means with a first input coupled with the self-check means and a second input coupled with the second signal developing means, said self-check means including means for applying self-check pulses periodically and alternately to said first input of the second logic means and the first input of the third logic means, a first turn-on detector, a first current sensing means coupled between the first mentioned secondary triac and the first turn-on detector, said first turn-on detector being coupled with said additional self-check gate driver for turning the additional secondary triac on and holding it on in the event the first mentioned secondary triac fails to turn on in response to the self-check pulses, a second turn-on detector, a second current sensing means coupled between the additional secondary triac and the second turn-on detector, said second turn-on detector being coupled with said first mentioned self-check gate driver for turning the first mentioned self-check triac on and holding it on in the event the additional secondary triac fails to turn on in response to the self-check pulses.

7. A relay for switching an electrical load comprising, a main switch adapted to be connected in series with the load and an electric power source, first and second self-check switches adapted to be connected in parallel with the load, control means operatively coupled with the main switch and with the first and second self-check switches for turning on the main switch and turning off the self-check switches and vice-versa whereby the load is deenergized by short-circuiting through the self-check switches if the main switch fails to turn off, self-check turn on means coupled with said self-check switches for applying self-check pulses periodically and alternately to said first and second self-check switches for turning them on for time intervals shorter than the response time of said load, turn-on detecting means coupled with said first and second self-check switches and coupled with said self-check turn-on means for holding one of the self-check switches turned-on if the other self-check switch fails to turn on in response to one of said self-check pulses.

8. The invention as defined in claim 7 including a current responsive circuit breaker connected in series with said main switch.

9. The invention as defined in claim 8 wherein said circuit breaker is a fuse.

10. The invention as defined in claim 8 wherein said self-check turn-on means includes a self-check pulse generating means, first and second self-check drivers coupled respectively with said first and second self-check switches, and wherein said turn-on detecting means includes a first turn-on detector having a first current sensing means and being coupled between said first self-check switch and said second self-check driver and wherein said turn-on detecting means includes a second turn-on detector having a second current sensing means and being coupled between said second self-check switch and said first self-check driver.

11. The invention as defined in claim 10 wherein said control means is adapted to be connected with a control switch for selectively producing a relay closing signal or a relay opening signal, a main switch driver coupled with said main switch, a first signal developing circuit operatively coupled between the control switch and the main switch driver for turning on the main switch in response to a relay closing signal and for turning it off in response to a relay opening signal, and a second signal developing circuit operatively coupled between said control switch and said first and second self-check drivers for turning off the self-check switches in response to a relay closing signal and for turning on the self-check switches in response to a relay opening signal.

12. The invention as defined in claim 11 including a signal pulse generator, said main switch driver including first logic means having a first input coupled with said first signal developing means and having a second input coupled with said signal pulse generator for producing a main switch turn-on signal in response to a relay closing signal and a main switch turn-off signal in response to a relay opening signal.

13. The invention as defined in claim 12 wherein said voltage source is an alternating voltage source, said self-check pulse generating means being synchronized with said alternating voltage and including means for producing a first train of self-check pulses with successive pulses in said first train occurring immediately prior to the negative-going zero crossing of alternate cycles of said alternating voltage and means for producing a second train of self-check pulses with successive pulses in said second train occurring immediately prior to the negative-going zero crossing of the remaining cycles of said alternating voltage.

14. The invention as defined in claim 13 wherein said first self-check driver includes a second logic means having a first input coupled with said second signal developing circuit and having a second input coupled with said self-check pulse generating means for receiving said first train of self-check pulses, and wherein said second self-check driver includes a third logic means having a first input coupled with said second signal developing circuit and having a second input coupled with said self-check pulse generating means for receiving said second train of self-check pulses.

15. The invention as defined in claim 14 wherein said first turn-on detector includes fourth logic means having a first input coupled with said self-check pulse generator and having a second input coupled with said first current sensing means and wherein said second turn-on detector includes fifth logic means having a first input coupled with said self-check pulse generator and having a second input coupled with said second current sensing means.

16. The invention as defined in claim 15 wherein said first turn-on detector also includes a first pulse-duty cycle responsive circuit coupled between the second current sensing means and said second input of said fourth logic means and wherein said second turn-on detector includes a second pulse-duty cycle responsive circuit coupled between said first current sensing means and said second input of said fifth logic means.

17. The invention as defined in claim 16 wherein said main switch and said first and second self-check switches are triacs.

* * * * *